United States Patent
Ogawa et al.

(10) Patent No.: US 12,131,933 B2
(45) Date of Patent: Oct. 29, 2024

(54) LOAD PORT

(71) Applicant: Sinfonia Technology Co., Ltd., Tokyo (JP)

(72) Inventors: Tatsuru Ogawa, Tokyo (JP); Yuki Ishihara, Tokyo (JP); Toshiya Sugimoto, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 17/880,555

(22) Filed: Aug. 3, 2022

(65) Prior Publication Data

US 2023/0039017 A1    Feb. 9, 2023

(30) Foreign Application Priority Data

Aug. 5, 2021  (JP) .................................. 2021-129029

(51) Int. Cl.
*H01L 21/677*  (2006.01)
*H01L 21/67*  (2006.01)

(52) U.S. Cl.
CPC .. *H01L 21/67772* (2013.01); *H01L 21/67265* (2013.01); *H01L 21/67778* (2013.01)

(58) Field of Classification Search
CPC ......... H01L 21/67778; H01L 21/67775; H01L 21/67772; H01L 21/67265
See application file for complete search history.

(56) References Cited

U.S. PATENT DOCUMENTS

| | | | | |
|---|---|---|---|---|
| 6,082,951 A | * | 7/2000 | Nering | H01L 21/67772 414/416.03 |
| 2015/0308812 A1 | * | 10/2015 | Natsume | G01B 11/002 356/612 |

FOREIGN PATENT DOCUMENTS

JP    2019102753 A    6/2019

* cited by examiner

*Primary Examiner* — Glenn F Myers
(74) *Attorney, Agent, or Firm* — Kilpatrick Townsend & Stockton LLP

(57) ABSTRACT

There is provided a load port, including: a frame including an opening via which a transfer target object is capable of passing in a substantially horizontal posture; a load port door configured to engage with a container door capable of opening and closing a loading/unloading port of a storage container including slots capable of accommodating the transfer target object in a multi-stage manner, and to open and close the opening of the frame; and a mapping mechanism configured to map information on an accommodation state including presence or absence of the transfer target object in each of the slots in the storage container via the opening and the loading/unloading port.

20 Claims, 16 Drawing Sheets

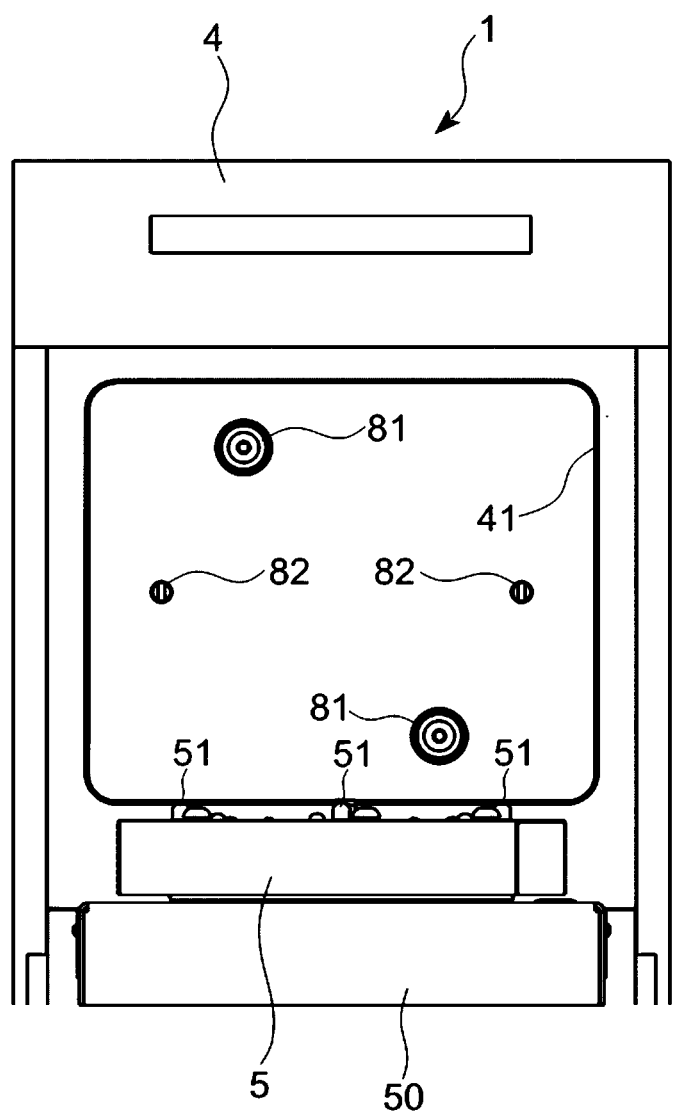

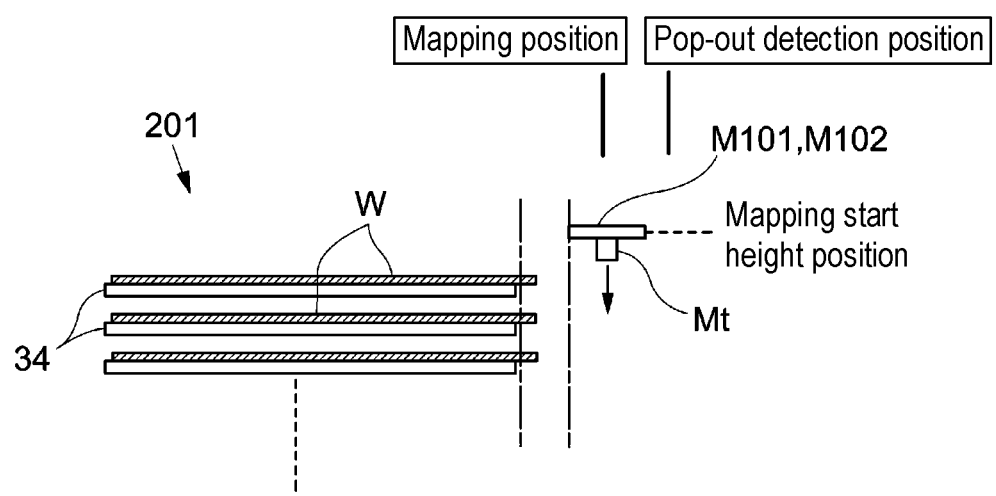

LOAD PORT

CROSS-REFERENCE TO RELATED APPLICATION

This application is based upon and claims the benefit of priority from Japanese Patent Application No. 2021-129029, filed on Aug. 5, 2021, the entire contents of which are incorporated herein by reference.

TECHNICAL FIELD

The present disclosure relates to a load port used for, in a semiconductor manufacturing process, delivering a transfer target object to and from a FOUP, which is a storage container capable of storing a plurality of transfer target objects such as wafers or the like in multi-stage slots. Particularly, the present disclosure pertains to a load port provided with a mapping mechanism for mapping information relating to a state including the presence or absence of a transfer target object in each slot of a FOUP.

BACKGROUND

For example, in a semiconductor manufacturing process, wafers are processed in a clean room in order to improve a yield and a quality. In recent years, a "mini-environment system" for further improving the cleanliness only in a local space around wafers has been introduced, and a means for transferring or processing wafers has been adopted. In the mini-environment system, a load port that constitutes a part of the wall surface of a wafer transfer chamber (hereinafter referred to as a transfer chamber) substantially closed inside a housing, mounts a FOUP (Front Opening Unified Pod), which is a storage container for storing transfer targets such as wafers or the like in a highly clean internal space, and has a function of opening and closing a FOUP door while making close contact with the FOUP door, is provided adjacent to the transfer chamber. In the following, a door for a load port that can be engaged with the FOUP door to open and close the FOUP door will be referred to as a "load port door."

Such a load port is a device for loading and unloading a transfer target object into and from a transfer chamber, and functions as an interface part between the transfer chamber and the FOUP. When the FOUP door and the load port door are opened at the same time with the load port door kept in close contact with the FOUP door, the transfer robot arranged in the transfer chamber can take out the transfer target object in the FOUP into the transfer chamber, or can store the transfer target object from the transfer chamber into the FOUP.

The load port is provided with a mapping mechanism capable of detecting the presence or absence and storage posture of a transfer target object in the multi-stage slots provided in the FOUP. In the conventional mapping mechanism, assuming that the transfer target object is circular, a mapping process is performed using a transmissive optical sensor whose sensing line (light transmission/reception line) is a line that crosses the tip portion (a part of the outer edge (circumference) constituting the circle) of the transfer target object positioned closer to the FOUP door than the center in the depth direction of the transfer target object, whereby the presence or absence of the transfer target object in each slot is detected.

As an example of the mapping mechanism, there is available a mapping mechanism configured so that a mapper equipped with a mapping sensor at the tip thereof can be moved between an unmappable position at which the mapper is retracted closer to the FOUP than the frame of the load port and a mappable portion at which the mapper is moved closer to the inside of the FOUP than the unmappable position via the opening of the frame. Further, the mapping mechanism is provided with a mapping movement part (mapping arm) that supports the mapper. By moving the mapping arm in the height direction while maintaining the mapper in the mappable position, it is possible to detect whether or not the transfer target object is stored in each slot constituting the multi-stage slots (the presence/absence detection). In addition, the detection of abnormal cross mounting in which transfer target objects are supported in slots at different heights (cross detection), and the detection of double mounting in which two transfer target objects are overlappingly supported in the same slot (double mounting detection) are also performed at the same time as the presence/absence detection. The elevating movement of the mapping arm is performed integrally or independently with the elevating movement of the load port door.

Although the mapping process using the above-mentioned mapping mechanism can be smoothly and appropriately performed if the transfer target object is circular, it cannot be performed on a panel or wafer having a shape other than a circular shape, for example, a rectangular shape.

That is, in the conventional mapping mechanism, it is necessary that the mapper equipped with the mapping sensor (e.g., a transmissive optical sensor provided with a light irradiation part and a light reception part) is caused to enter the FOUP during the mapping process, and the light irradiation part and the light reception part are arranged at a position at which the outer peripheral edge of the transfer target object can be securely sandwiched from the substantially horizontal direction. If the transfer target object is circular, it is possible to secure a space between the outer peripheral surface of the transfer target object and the inner surface of the FOUP on the FOUP door side. However, if the transfer target object is, for example, a so-called square glass substrate or the like having a square or rectangular shape, the occupied area of the square or rectangular transfer target object in the FOUP is larger than that in the case of the transfer target object having a circular shape. Therefore, it is impossible or extremely difficult to secure an enough space for entry of the sensor of the mapping mechanism between the outer peripheral surface of the transfer target object and the inner surface of the FOUP.

Meanwhile, Patent Document 1 proposes a load port provided with a mapping mechanism that includes a light emitting part for irradiating a transfer target object with imaging light and an imaging part for capturing an image by imaging an illumination area illuminated by the irradiation light from the light emitting part and acquiring an image. Specifically, Patent Document 1 discloses a configuration in which one imaging part is provided in association with one light emitting part that irradiates light so that only one transfer target object is included in the illumination area, the light emitting part irradiates imaging light toward the transfer target object, and the imaging part captures an image by imaging the illumination area illuminated by the light emitting part, whereby the accommodation state of a square transfer target object can be grasped based on the image thus acquired.

PRIOR ART DOCUMENTS

Patent Documents

Patent Document 1: Japanese Patent Application Publication No. 2019-102753 However, in the above-mentioned mapping mechanism that irradiates light so that only one transfer target object is included in the illumination area, the illumination area occupied by the entire transfer target object becomes smaller as the size of the square transfer target object increases. Therefore, it may not be possible to perform accurate cross detection with only one captured image for one transfer target object. For example, when a configuration in which the transfer target object is supported by support portions such as slots or the like provided at three left, right and center locations in a FOUP is adopted as the configuration for supporting a large transfer target object in the FOUP, it may be impossible to accurately detect, only with one captured image, three types of cross abnormal mounting, i.e., i) cross abnormal mounting in which the transfer target object is mounted in such a state that the right and center of the transfer target object are supported by the support portions at the same height position, and only the left is not supported by the support portion at the same height position as the right and center (the left is supported by the support portion at a different height position from the right and center or not supported by any support portion), ii) cross abnormal mounting in which the transfer target object is mounted in such a state that the left and center of the transfer target object are supported by the support portions at the same height position, and only the right is not supported by the support portion at the same height position as the left and center (the right is supported by the support portion at a different height position from the left and center or not supported by any support portion), and iii) cross abnormal mounting in which the transfer target object is mounted in such a state that the left and right of the transfer target object are supported by the support portions at the same height position, and only the center is not supported by the support portion at the same height position as the left and right (the center is supported by the support portion at a different height position from the left and right or not supported by any support portion). In particular, if the transfer target object is large and thin, it is expected that the transfer target object will be accommodated in a bent state due to its thinness in addition to its own weight. Such bent mounting in which the transfer target object is accommodated in a bent state may be regarded as one aspect of the cross abnormal mounting.

Further, in the case of the mapping mechanism described in Patent Document 1, it is required to perform a process of acquiring a captured image by imaging an illumination area illuminated by the irradiation light from the light emitting part and a process of identifying an accommodation state of the transfer target object based on the captured image thus acquired. As compared with a mapping mechanism that can identify an accommodation state of a transfer target object by detecting a light reception state or a light blocking state, the mapping mechanism described in Patent Document 1 requires a higher level of process and a longer cycle time.

In Patent Document 1, there is disclosed an aspect in which two mapping sensors are provided to image different fields of view of the transfer target object, the accommodation state is determined based on the captured image acquired by one of the mapping sensors, and the accommodation state is determined based on the captured image acquired by the other mapping sensor. In this case, if the determinations of the accommodation states based on the two captured images are "good," it can be determined that the accommodation state of the transfer target object is "good." If the determination of the accommodation state based on one of the captured images is "bad," it can be determined that the accommodation state of the transfer target object is "bad." However, the number of captured images increases, which requires a lot of time for the image processing and determination. In addition, since the number of light emitting parts and imaging units increases, the equipment cost becomes very high.

SUMMARY

The present disclosure has been made by paying attention to such problems, and provides a load port capable of avoiding an increase in the size of an apparatus as a whole and capable of accurately and correctly detect an accommodation state of a transfer target object in a storage container even if the transfer target object has a rectangular plan-view shape and a large size.

That is, the load port according to the present disclosure includes: a frame including an opening via which a transfer target object is capable of passing in a substantially horizontal posture; a load port door configured to engage with a container door capable of opening and closing a loading/unloading port of a storage container including slots capable of accommodating the transfer target object in a multi-stage manner, and to open and close the opening of the frame; and a mapping mechanism configured to map information on an accommodation state including presence or absence of the transfer target object in each of the slots in the storage container via the opening and the loading/unloading port, wherein the mapping mechanism includes: two mapping sensors configured to move up and down integrally with or independently of ascending/descending movement of the load port door when opening and closing the opening, and capable of detecting an end surface of the transfer target object by irradiating detection waves toward an inside of the storage container; and a determination part configured to determine whether the accommodation state of the transfer target object is good or bad based on sensing information obtained by the two mapping sensors.

According to the load port of the present disclosure, it is possible for the mapping mechanism including the two mapping sensors to map information on the accommodation state including the presence or absence of the transfer target object in each of the slots in the storage container.

Therefore, in the case of the load port of the present disclosure, even for a large thin transfer target object having a rectangular plan-view shape and having a linear end surface extending over substantially the entire opening width at the loading/unloading port of the storage container, it is possible for the two mapping sensors to detect the accommodation state of the transfer target object in the storage container accurately and correctly.

Moreover, in the case of the load port of the present disclosure, it is possible for the mapping mechanism to map the information on the accommodation state including the presence or absence of the transfer target object in each of the slots in the storage container without imaging and image processing. As compared with an image processing system using a camera or the like, it is possible to speed up the process of detecting the transfer target object, and it is possible to keep the cost of the system low.

In the present disclosure, one preferred example of the configuration of "map the information on the accommodation state including the presence or absence of the transfer target object in each of the slots in the storage container without imaging and image processing" may include a configuration in which mapping is performed (the good/bad of the accommodation state of the transfer target object is determined) by detecting the end surface of the transfer target object with each mapping sensor having the above-mentioned predetermined detection target area.

Further, in the load port of the present disclosure, a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port.

According to the load port of the present disclosure, the two mapping sensors are arranged side by side on the common mapping arm so as to be horizontally spaced apart from each other, and one end side portion and the other end side portion of the end surface of the transfer target object facing the loading/unloading port are detected by the two mapping sensors, respectively. Therefore, as compared with the case where the two detection target areas are set only at one end side portion or only at the other end side portion of the loading/unloading port of the storage container, it is possible for the determination part to reliably identify that the transfer target object is accommodated in the horizontal posture, based on the sensing information obtained by the two mapping sensors.

Further, in the load port of the present disclosure, the determination part is configured to determine whether or not the transfer target object is located at a normal height position in each of the slots, by detecting a height position of the transfer target object based on the sensing information of at least one of the two mapping sensors and comparing the detected height position with the normal height position of the transfer target object in each of the slots.

According to the load port of the present disclosure, the height position of the transfer target object can be detected based on the sensing information of at least one of the two mapping sensors. Therefore, it is possible to reliably detect whether or not the transfer target object in each of the slots in the storage container is located at the normal position.

Further, in the load port of the present disclosure, the mapping mechanism is configured to: before starting the sensing, by the two mapping sensors, to determine whether the accommodation state of the transfer target object is good or bad, perform sensing to detect pop-out of the transfer target object stored in the storage container by using at least one of the two mapping sensors.

According to the load port of the present disclosure, the pop-out of the transfer target object stored in the storage container is detected by using at least one of the two mapping sensors. Therefore, it is not necessary to separately provide a sensor for detecting the pop-out of the transfer target object. This makes it possible to reduce the manufacturing cost.

Further, in the load port of the present disclosure, a beam emitted from at least one of the two mapping sensors has a strip shape extending along the end surface of the transfer target object.

According to the load port of the present disclosure, the end surface of the transfer target object can be reliably detected by the beam radiated from at least one of the two mapping sensors without being easily affected by disturbance.

BRIEF DESCRIPTION OF DRAWINGS

The accompanying drawings, which are incorporated in and constitute a part of the specification, illustrate embodiments of the present disclosure.

FIG. 4 is a front view showing the load port of FIG. 1 with a part thereof omitted.

FIGS. 14A, 14B and 14C are diagrams illustrating a method of moving the mapping sensor in the load port shown in FIGS. 13A, 13B and 13C.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the drawings.

First Embodiment

Figure 1:
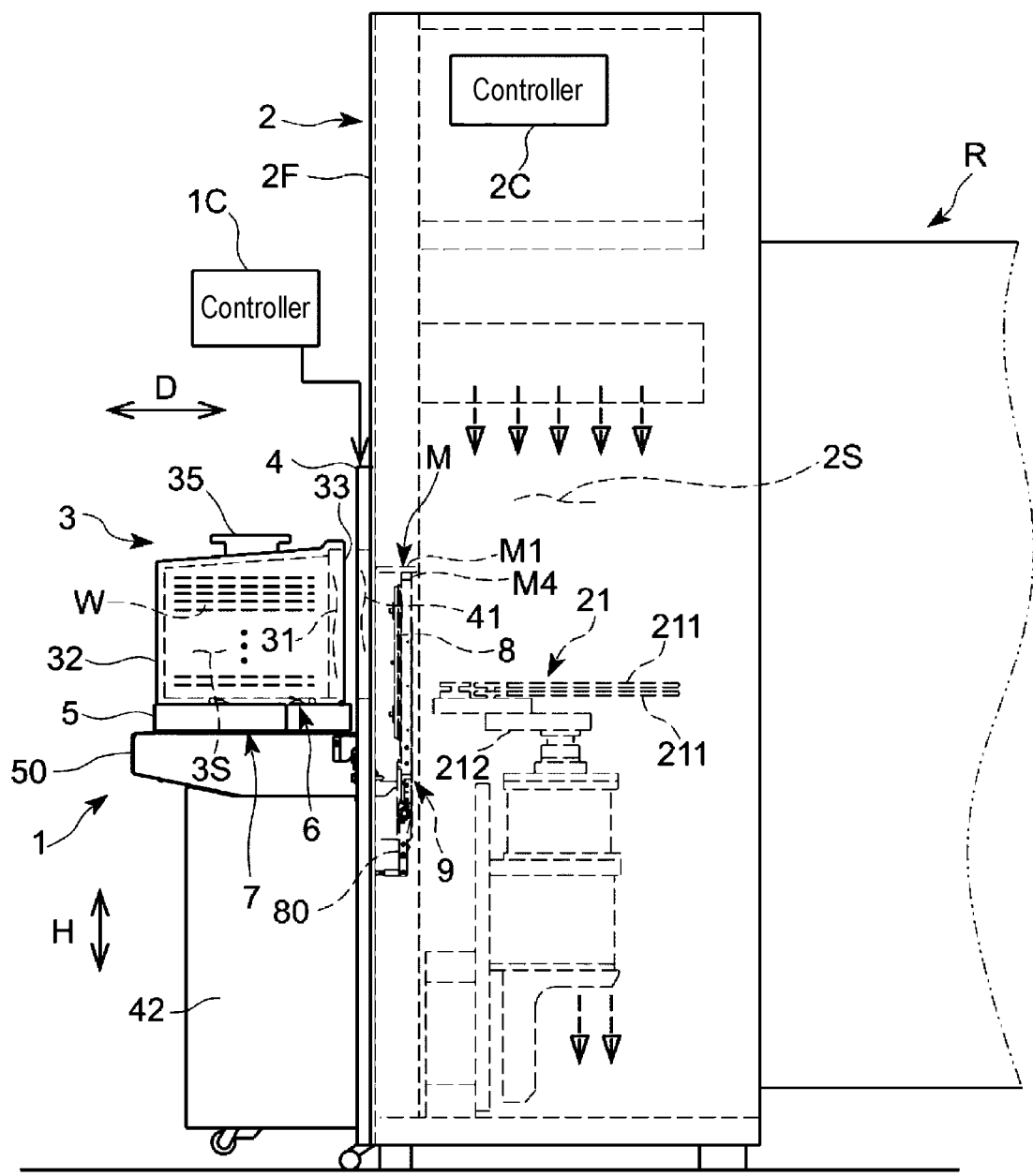
FIG. 1 is a side view schematically showing the relative positional relationship between an EFEM provided with load ports according to a first embodiment of the present disclosure and a peripheral device thereof.
Figure 2:
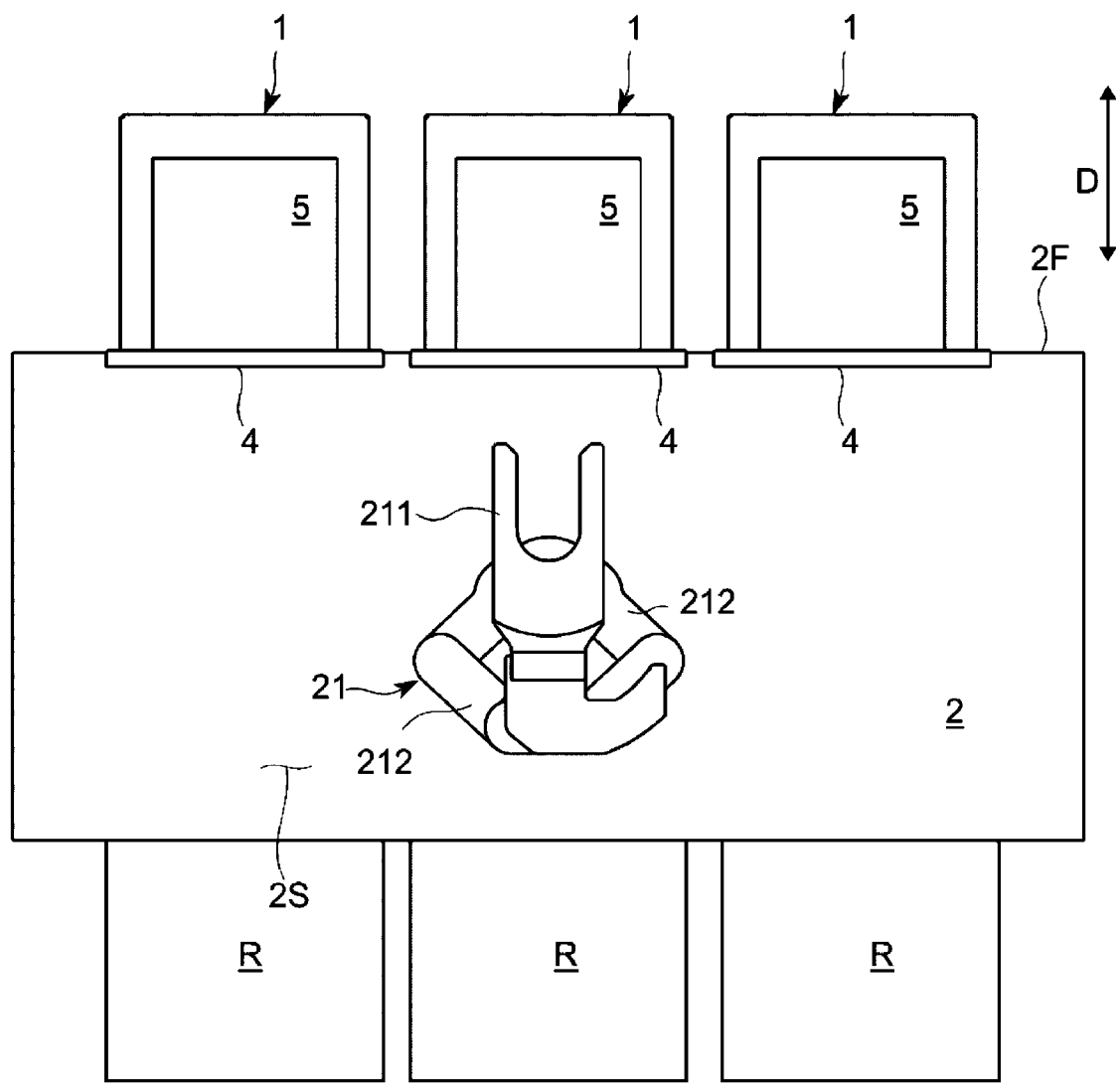
FIG. 2 is a plan view simplifying the relative positional relationship between the load ports shown in FIG. 1.

The load port 1 of the present embodiment is used, for example, in a semiconductor manufacturing process. As shown in FIGS. 1 and 2, the load port 1 constitutes a part of a wall surface of a transfer chamber 2 in a clean room and performs the loading and unloading of a transfer target object W to and from the transfer chamber 2 and a storage container 3 such as a FOUP or the like. As the material of the transfer target object W, glass, resin, stainless steel, or the like may be used. The load port 1 constitutes a part of an EFEM (Equipment Front End Module) and functions as an interface part between the storage container 3 and the transfer chamber 2. In the present embodiment, a relatively large thin transfer target object W (e.g., a glass substrate having a plan-view size of 600 mm×600 mm or 515 mm×510 mm and a thickness of 0.2 mm to 2 mm) having a rectangular shape (square shape) is used. In the present embodiment, as shown in FIG. 2, a plurality of (e.g., three) load ports 1 are arranged side by side on the front surface (front wall surface) 2F of the transfer chamber 2. The operation of the EFEM is controlled by the controller of the load port 1 (controller 1C shown in FIG. 1) or the controller of the entire EFEM (controller 2C shown in FIG. 1).

In the internal space 2S of the transfer chamber 2, there is provided a transfer robot 21 capable of transferring a transfer target object such as a glass substrate or the like between the storage container 3 on the load port 1 and a processing chamber R. As shown in FIGS. 1 and 2, the transfer robot 21 includes, for example, an arm 212 having a plurality of link elements connected to each other so as to be able to rotate horizontally and a transfer target object grip portion 211 (hand) provided at the tip portion thereof, and a traveling portion configured to rotatably support an arm base constituting the base end portion of the arm 212 and travel in the width direction of the transfer chamber 2 (the parallel direction of the load port 1). The transfer robot 21 includes a link structure (articulated structure) whose shape is changed between a folded state in which the arm length is minimized and an extended state in which the arm length is longer than in the folded state. A transfer robot 21 in which a plurality of individually controllable hands 211 are provided in multiple stages in the height direction may be applied to the tip of the arm 212. Further, a transfer robot having no traveling part and having a fixed installation position may be applied, or a stationary robot may be used as the transfer robot.

The transfer chamber 2 is configured so that the internal space 2S is substantially sealed by connecting the load port 1 and the processing chamber R. A downflow, which is an airflow moving from above to below, is formed in the internal space 2S of the transfer chamber 2. Therefore, even if particles that contaminate the surface of the transfer target object W are present in the internal space 2S of the transfer chamber 2, the particles are pushed downward by the downflow, which makes it possible to suppress the adhesion of particles to the surface of the transfer target object W under transfer. In FIG. 1, the flow of a gas in the transfer chamber 2 forming the downflow is indicated by arrows. It is also possible to configure an EFEM in which appropriate stations such as a buffer station, an aligner and the like are arranged on the side surface of the transfer chamber 2 or the internal space 2S of the transfer chamber 2.

The internal space 2S of the transfer chamber 2 and the internal space 3S of the storage container 3 mounted on each load port 1 are maintained at a high degree of cleanliness. On the other hand, the space in which the load port 1 is arranged, i.e., the outside of the processing chamber and the outside of the EFEM, is maintained at a relatively low degree of cleanliness. FIGS. 1 and 2 are diagrams schematically showing the relative positional relationship between the load port 1 and the transfer chamber 2, and the relative positional relationship between the EFEM provided with the load ports 1 and the transfer chamber 2 and the processing chamber R.

Figure 3:
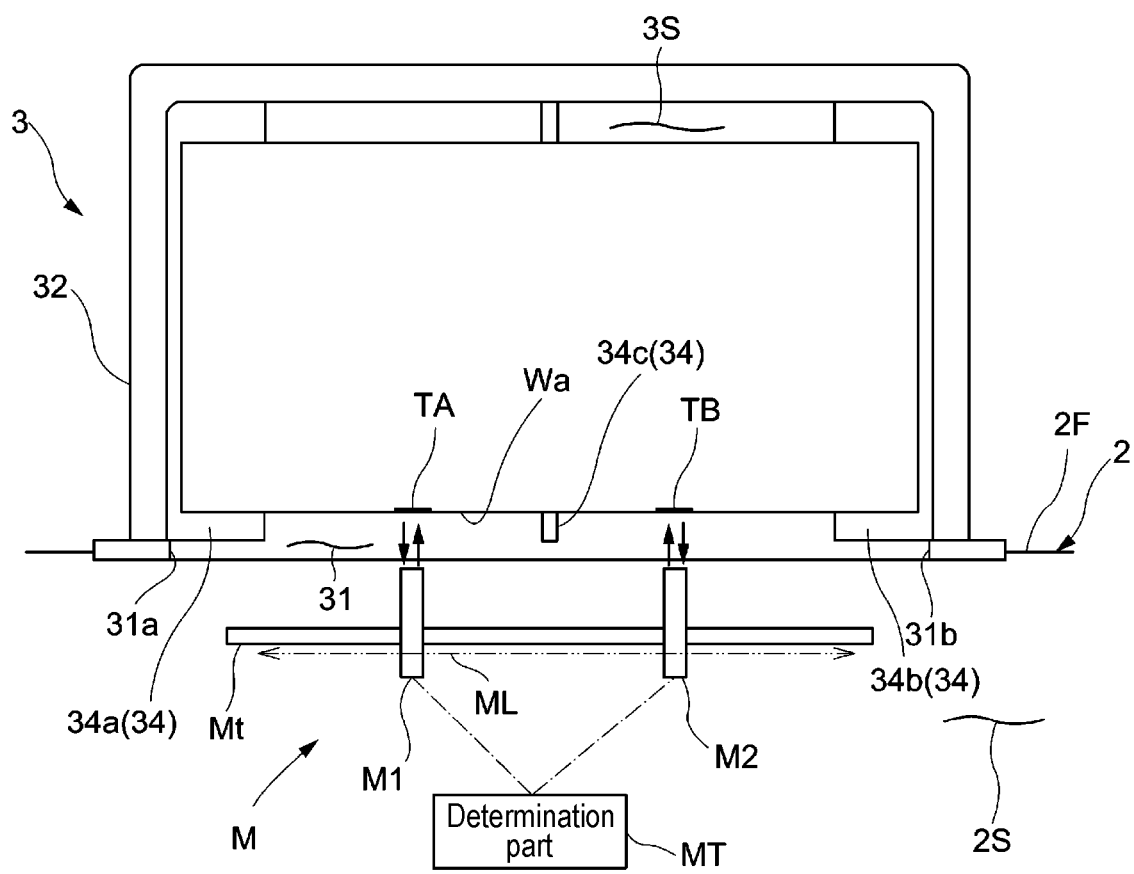
FIG. 3 is a diagram schematically showing the relative positional relationship between a transfer target object accommodated in a slot in a storage container and a mapping mechanism in the load port shown in FIG. 1.
Figure 5A:
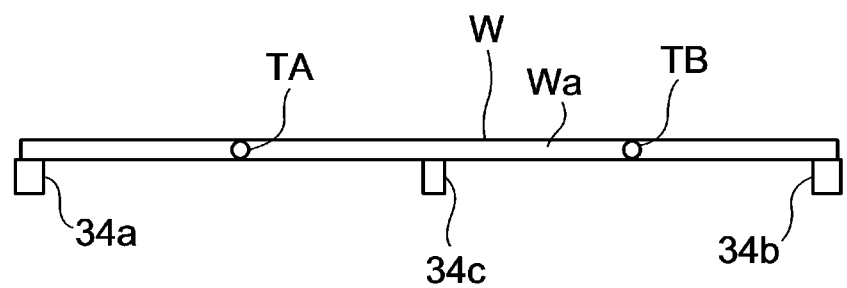
FIGS. 5A and 5B are diagrams schematically showing a detection target area of a mapping sensor in the load port shown in FIG. 1.

As schematically shown in FIG. 1, the storage container 3 according to the present embodiment includes a container body 32 that can open the internal space 3S only to the rear side via a loading/unloading port 31, and a container door 33 that can open and close the loading/unloading port 31. As shown in FIG. 3, the storage container 3 is provided with slots 34 constituting multi-stage slots therein, and is configured so that each slot 34 can accommodate the transfer target object W and so that the transfer target object W can be loaded and unloaded via the loading/unloading port 31. In the present embodiment, as shown in FIG. 5A, in the storage container 3, both side portions of the transfer target object W are supported by slots 34a and 34b at the same height position, and the central portion of the transfer target object W in the width direction is supported by the slot 34c at the same height position as the slots 34a and 34b. A flange portion 35 to be gripped by a device (e.g., an OHT: Overhead Transport) for automatically transferring the storage container 3 is provided on the upward surface of the container body 32 (see FIG. 1).

As shown in FIG. 1 and the like, the load port 1 of the present embodiment includes a plate-shaped frame 4 constituting a part of the wall surface of the transfer chamber 2 and having an opening 41 for opening the internal space 2S of the transfer chamber 2, a mounting table 5 provided in a substantially horizontal posture to protrude forward with respect to the frame 4, a seating holding mechanism 6 configured to hold the storage container 3 transferred from the outside on the mounting table 5, a traction mechanism 7 configured to move the storage container 3 in a front-rear direction D between a seating position and a transfer target object delivery position on the mounting table 5, a load port door 8 configured to open and close the opening 41 of the frame 4, a door opening/closing mechanism 9 configured to open the opening 41 of the frame 4 by moving the load port door 8 to a door opening position retracted toward the transfer chamber 2, and a mapping mechanism M configured to map information about an accommodation status including the presence or absence of the transfer target object W in each slot 34 (34a, 34b and 34c) in the storage container 3 located at the transfer target object delivery position in a state in which the opening 41 of the frame 4 is opened by the door opening/closing mechanism 9.

The frame 4 is arranged in an upright posture and has a substantially rectangular plate shape with the opening 41 having a size that allows communication with the loading/unloading port of the storage container 3 mounted on the mounting table 5. FIG. 1 schematically shows the opening 41 of the frame 4. The load port 1 of the present embodiment constitutes a part of the wall surface of the transfer chamber 2 by the frame 4. At the lower end of the frame 4, a leg portion 42 including casters and installation legs is provided.

The mounting table 5 is provided on the upper portion of a horizontal base 50 (support base) arranged in a substantially horizontal posture at a position slightly above the height direction center of the frame 4, and is capable of mounting the storage container 3 in such an orientation that the container body 32 faces the frame 4. As shown in FIG. 4, the mounting table 5 is provided with a plurality of protrusions 51 protruding upward. By allowing the protrusions 51 to engage with holes (not shown) formed on the bottom surface of the storage container 3, the storage container 3 is positioned on the mounting table 5.

The seating holding mechanism 6 is configured to hold the storage container 3 on the mounting table 5 by establishing a locked state in which the locking claws (not shown) provided on the mounting table 5 are hooked and fixed to the locked portions (not shown) provided on the bottom surface of the storage container 3. Further, in the load port 1 of the present embodiment, the storage container 3 can be separated from the mounting table 5 by releasing the locked state of the locking claws with respect to the locked portions.

The traction mechanism 7 is configured to move the storage container 3 on the mounting table 5 in a front-rear direction D between a seating position at which the container body 32 is spaced apart from the load port door 8 by a predetermined distance and a transfer target object delivery position at which the container body 32 is brought into close contact with the load port door 8. The traction mechanism 7 is configured by using a slide rail or the like (not shown) that moves the mounting table 5 back and forth. The seating holding mechanism 6 and the traction mechanism 7 may also be regarded as the mechanisms provided in the mounting table 5.

In addition, in FIG. 1, the mounting state of the storage container 3 on the mounting table 5 is simplified as a state in which the bottom surface of the storage container 3 is in contact with the upper surface of the mounting table 5. However, in reality, the protrusions 51 protruding upward from the upper surface of the mounting table 5 support the storage container 3 by engaging with the bottom-closed holes formed on the bottom surface of the storage container 3. The upper surface of the mounting table 5 and the bottom surface of the storage container 3 do not come into contact with each other. A predetermined gap is formed between the upper surface of the mounting table 5 and the bottom surface of the storage container 3.

In the present embodiment, in the front-rear direction D (see FIG. 1 and the like) in which the storage container 3 mounted on the mounting table 5 and the frame 4 are arranged side by side, the storage container 3 side is defined as a front side and the frame 4 side is defined as a rear side.

The load port door 8 is movable among a fully closed position at which the load port door 8 seals the opening 41 of the frame 4, a door opening position at which the load port door 8 is retracted toward the transfer chamber 2 from the fully closed position, and a fully opened position at which the load port door 8 fully opens the opening space of the opening 41 rearward. In order to schematically depict the appearance of the load port door 8 and the mapping mechanism M described later, FIG. 1 shows a state in which the load port door 8 is located at the door opening position. However, in the actual operation, the load port door 8 is located at the door opening position in a state in which the storage container 3 is moved to the transfer target object delivery position (at which the container body 32 is brought into close contact with the load port door 8) and the container door 33 is engaged and held. That is, it is important that the inside of the EFEM and the inside of the transfer chamber 2 are not opened to the external space.

The load port door 8 includes an engaging portion 81 capable of sucking and holding the container door 33 of the storage container 3 (see FIG. 4), and is configured to be movable among the fully closed position, the door opening position and the fully opened position together with the container door 33 while maintaining the engaged state with the container door 33. The movement route of the load port door 8 between the fully closed position and the fully opened position includes a route (horizontal route) through which the load port door 8 at the fully closed position is moved toward the transfer chamber 2 side to the door opening position while maintaining its height position, and a route (vertical route) via which the load port door 8 at the door opening position is moved downward to the fully opened position while maintaining its front-rear position. In order to assure that the load port door 8 located at the door opening position can move in both the vertical direction and the horizontal direction, the container door 33 held by the load port door 8 located at the door opening position is positioned at a position behind the frame 4 (a position at which the container door 33 is completely spaced apart from the container body 32 and arranged in the internal space 2S of the transfer chamber 2) together with the load port door 8.

Such movement of the load port door 8 is realized by the door opening/closing mechanism 9 provided in the load port 1. The door opening/closing mechanism 9 is configured to bring the internal space 3S of the storage container 3 into communication with the transfer chamber 2 via the opened opening of the frame 4 by moving the load port door 8 to the door opening position or the fully opened position. The door opening/closing mechanism 9 is configured by, for example, a movable block (not shown) that supports a support frame 80 for supporting the load port door 8 so as to be movable in the front-rear direction D, and a slide rail (not shown) that supports the movable block so as to be movable in the vertical direction H. The door opening/closing mechanism 9 operates a drive source (not shown) such as an actuator or the like to move the load port door 8 in the front-rear direction D and the vertical direction H. An actuator for front-rear movement and an actuator for vertical movement may be provided separately. However, in terms of reducing the number of components, it is preferable that the load port door 8 is moved in the front-rear direction and the vertical direction by using a common actuator as a drive source.

The load port door 8 of the present embodiment includes a connection switching mechanism 82 for releasing the engagement state (latch state) between the container door 33 and the container body 32 to establish a state (unlatch state) in which the container door 33 can be removed from the container body 32 (see FIG. 4). Further, the load port 1 of the present embodiment may include a bottom purge part configured to inject an environmental gas (also referred to as a purge gas) (a nitrogen gas or a dry air is mainly used in the present embodiment), which is an appropriately selected gas such as nitrogen gas, an inert gas or a dry air, into the storage container 3 from the bottom surface side of the storage container 3 mounted on the mounting table 5, and capable of replacing the gas atmosphere in the storage container 3 with the environmental gas. The bottom purge part is mainly composed of a plurality of nozzles (not shown) provided at predetermined locations on the mounting table 5. The nozzles are allowed to function as a bottom purge injection nozzle for injecting a predetermined environmental gas and a bottom purge discharge nozzle for discharging a gas atmosphere in the storage container 3.

These plurality of nozzles can be connected in a state of being fitted to an injection port and a discharge port (both of which are not shown) provided at the bottom of the storage container 3. The environmental gas is supplied from the bottom purge injection nozzle to the internal space 3S of the storage container 3 via the injection port, and the gas atmosphere in the internal space 3S of the storage container 3 is discharged from the bottom purge discharge nozzle via the discharge port (the gas atmosphere is an air or an environmental gas other than an air having a low degree of cleanliness for a predetermined time from the start of execution of a purging process, and is an environmental gas having a high degree of cleanliness filled in the internal space 3S of the storage container 3 after the predetermined time has elapsed), whereby a purging process can be performed.

As shown in FIG. 3, the mapping mechanism M includes two mapping sensors M1 and M2 capable of detecting the presence or absence of transfer target objects W stored in a multi-stage shape in the height direction H by respective slots (multi-stage slots) 34 provided inside the storage container 3, a mapping arm Mt configured to support the two mapping sensors M1 and M2 at the same height position, and a determination part MT configured to determine whether the accommodation state of the transfer target object W is good or bad based on the sensing information obtained by the two mapping sensors M1 and M2. The mapping mechanism M is capable of detecting the presence or absence of the transfer target object W in the storage container 3 and the accommodation posture thereof.

The mapping sensors M1 and M2 function as an end surface detection part capable of detecting an end surface Wa of the transfer target object W. In the present embodiment, as the mapping sensors M1 and M2, it may be possible to use photoelectric sensors capable of acquiring an output signal (sensing information) by irradiating light such as visible light or infrared light from a light emitting part and detecting a change in the amount of light reflected or blocked by the transfer target object W as a detection object using a light receiving part. Particularly, in the present embodiment, a reflection type photoelectric sensor (reflection type sensor) in which a transmitter (light emitting sensor or light emitting element) for emitting a beam (linear light) and a receiver (light receiving sensor or light receiving element) for receiving the beam emitted from the light emitting element and reflected by the end surface Wa of the transfer target object W are built in one sensor amplifier is used.

As shown in FIGS. 3 and 5A, the two mapping sensors M1 and M2 of the mapping mechanism M may be divided into a first mapping sensor M1 whose detection target area TA is a portion on the one end 31a side of the loading/unloading port 31 of the storage container 3, and a second mapping sensor M2 whose detection target area TB is a portion on the other end 31b side of the loading/unloading port 31 of the storage container 3. As shown in FIG. 5A, the detection target areas TA and TB of the mapping sensors M1 and M2 are sensor light irradiation areas indicated by a circle, specifically irradiation areas having a diameter substantially equal to the thickness of one transfer target object W to be detected. As can be seen from FIG. 5A, these two detection target areas TA and TB are at the same height position. Further, the detection target area of the mapping sensor may be appropriately changed according to the thickness of the transfer target object W. Further, the positions of the mapping sensors (sensor positions) may be adjustable in the left-right width direction.

As shown in FIG. 3, the detection target area TA of the first mapping sensor M1 is a portion on the one end 31a side of the loading/unloading port 31 of the storage container 3, specifically, an area of an intermediate point between the slot 34a provided on one side wall of the container body 32 of the storage container 3 and the slot 34c provided at the width direction center of the container body 32 (at the width direction center of the loading/unloading port 31). Further, the detection target area TB of the second mapping sensor M2 is a portion on the other end 31b side of the loading/unloading port 31 of the storage container 3, specifically, an area of an intermediate point between the slot 34b provided on the other side wall of the container body 32 of the storage container 3 and the slot 34c provided at the width direction center of the container body 32 (at the width direction center of the loading/unloading port 31). That is, the detection target areas TA and TB of the first mapping sensor M1 and the second mapping sensor M2 are set so that the sensor light for detecting the presence or absence of the transfer target object W does not irradiate the slots 34 (34a, 34b and 34c).

In the load port 1 of the present embodiment, if the transfer target object W accommodated in the storage container 3 is at a position popping out from the storage container 3 rather than a normal position during a mapping process, the mapping sensors M1 and M2 may collide with the transfer target object W. In order to avoid this situation, a pop-out sensor (e.g., a pop-out sensor with a detection wave irradiation axis directed in the height direction) (not shown) for detecting a popped-out transfer target object W is provided at the width-direction center of the loading/unloading port 31.

As shown in FIG. 3, the mapping arm Mt is a long arm extending in the horizontal direction, and is configured to support the two mapping sensors M1 and M2 in a state of being fixed at predetermined positions spaced apart from each other in the horizontal direction. Each of the mapping sensors M1 and M2 is supported in a posture in which the tip thereof faces forward and protrudes forward beyond the mapping arm Mt. In the present embodiment, as shown in FIG. 3, the direction in which the two mapping sensors M1 and M2 are arranged side by side (the mapping sensor arrangement direction ML indicated by a two-dot chain line in FIG. 3) is set to a direction parallel or substantially parallel to the extension direction of the end surface Wa of the transfer target object W which faces the loading/unloading port 31. In addition, the mounting and fixing positions of the mapping sensors M1 and M2 with respect to the mapping arm Mt are set so that a predetermined gap (of, e.g., 56 mm) is formed between each tip of the mapping sensors M1 and M2 and the end surface Wa of the transfer target object W.

In some cases, it may be permitted to place the transfer target object W in the storage container 3 at a position deviated by about ±several mm from the normal position. In such a case, the positions of the mapping sensors M1 and M2 are made changeable so as to cope with the deviation, whereby an appropriate spaced-apart distance can be secured between each tip of the mapping sensors M1 and M2 and the end surface Wa of the transfer target object W. In the load port 1 of the present embodiment, the mapping arm Mt is attached to a part constituting the door opening/closing mechanism 9 (see FIG. 1). Therefore, the mapping arm Mt also operates integrally with the raising/lowering operation of the load port door 8 by the door opening/closing mechanism 9. As a result, the entire mapping mechanism M moves up and down in the same direction as the load port door 8. It may also be possible to adopt a configuration in which the mapping arm Mt is attached to the upper end of the load port door 8 directly or via another part, or a configuration in which the mapping sensors M1 and M2 are directly attached to the load port door 8 without the mapping arm Mt being interposed therebetween. Even with such a configuration, the entire mapping mechanism M moves up and down in the same direction as the load port door 8.

As the mapping mechanism M, it may be possible to adopt a mapping mechanism capable of controlling the ascending/descending movement of the mapping arm Mt by a stepping motor (not shown) and identifying the height position of the mapping sensors M1 and M2 based on the number of pulses of the stepping motor. In this case, the mapping arm Mt moves up and down independently of the ascending/descending movement of the load port door 8. That is, it is possible to appropriately select whether or not the mapping sensors M1 and M2 of the mapping mechanism M share the raising/lowering mechanism with the load port door 8.

The determination part MT determines whether the accommodation state of the transfer target object W is good or bad based on the sensing information obtained by the two mapping sensors M1 and M2. Each of the mapping sensors M1 and M2 emits a beam (linear light) as a signal, and detects the presence or absence of the transfer target object W in the detection target areas TA and TB depending on whether or not the signal is received. The trajectory of the beam (linear light line) may be regarded as a detection line. That is, as indicated by a straight line arrow in FIG. 3, the detection line during the mapping process includes a signal transmission time straight line extending from the internal space 2S side of the transfer chamber 2 toward the end surface Wa of the transfer target object W, and a signal reception time straight line extending from the end surface Wa of the transfer target object W toward the internal space 2S side of the transfer chamber 2. When a signal (beam) is emitted from the transmitter of each of the mapping sensors M1 and M2 toward the front side during the mapping process, if the end surface Wa of the transfer target object W exists in front of the transmitter, the signal reflected by the end surface Wa of the transfer target object W reaches the receiver of each of the mapping sensors M1 and M2. On the other hand, if the end surface Wa of the transfer target object W does not exist in front of the transmitter, the signal does not reach the receiver because it is not reflected by the end surface Wa of the transfer target object W. Based on the reception or non-reception of such a signal, it is possible for the mapping sensors M1 and M2 to sequentially detect whether or not the end surface Wa of the transfer target object W is present in the detection target areas TA and TB. The determination part MT is formed inside, for example, a controller 1C.

Figure 5B:
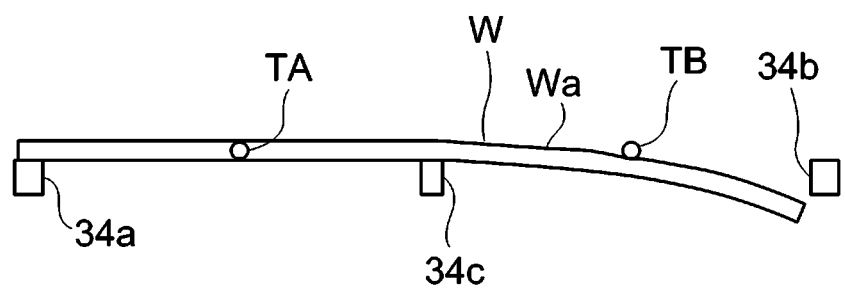

Then, when the two mapping sensors M1 and M2 receive signals simultaneously or substantially simultaneously (signal ON: when the reflected light is received), that is, when the end surface Wa of the transfer target object W exists in the detection target areas TA and TB of the two mapping sensors M1 and M2 as shown in FIG. 5A, the determination part MT identifies that the transfer target object W is accommodated in a normal posture (horizontal posture). When the signal is not received by the other mapping sensor at the timing when the signal is received by any one of the two mapping sensors M1 and M2 (signal OFF: when the reflected light is not received), for example, when the end surface Wa of the transfer target object W does not exist in the detection target area TB of the second mapping sensor M2 as shown in FIG. 5B, the determination part MT identifies that the transfer target object W is not accommodated in a normal posture (cross abnormal mounting). When the signals are not received by both the two mapping sensors M1 and M2, the determination part MT identifies that the transfer target object W is not accommodated. In this way, the determination part MT not only determines whether or not the transfer target object W is accommodated, but also determines whether the transfer target object W is accommodated in the horizontal posture or whether the transfer target object W is not accommodated in the horizontal posture (cross abnormal mounting), depending on whether or not the two mapping sensors M1 and M2 arranged side by side in the horizontal direction detect signals simultaneously or substantially simultaneously (signal ON).

In particular, as shown in FIG. 5B, when the large transfer target object W is accommodated in a bent state due to its own weight, thinness, or the like, if the degree of bending is large, the other mapping sensor does not receive a signal at the timing when one of the two mapping sensors M1 and M2 receives a signal. Therefore, based on this detection information, the determination part MT identifies that the transfer target object W is not accommodated in a normal posture (horizontal posture). The bent mounting may be regarded as one aspect of cross abnormal mounting. That is, if the transfer target object has a large thickness (thickness) and is close to a rigid body, the transfer target object will not be bent. Therefore, when the determination part MT identifies cross abnormal mounting in which the transfer target object is not accommodated in a horizontal posture, the transfer target object is accommodated in an inclined posture as a whole (a posture in which the form having a straight line shape in the width direction as a whole).

On the other hand, as shown in FIG. 5B, in the case of a transfer target object W having a small thickness, when cross abnormal mounting is identified by the determination part MT, the transfer target object W is accommodated in a posture in which at least a part of the transfer target object W is bent. In the cross abnormal mounting shown in FIG. 5B, the portion of the transfer target object W extending from the region near the left end to the center in the width direction on the drawing sheet surface is supported by the slots 34a and 34c at the same height position, but the transfer target object W is not supported by the slot 34b having the same height as the slots 34a and 34c. The region near the right end of the transfer target object W on the drawing sheet surface, which is not supported by the slot 34b, floats in the air. For example, the state in which the region near the left end and the central portion in the width direction of the transfer target object W on the drawing sheet surface are supported by the slots 34a and 34c at the same height position and the region near the right end of the transfer target object W on the drawing sheet surface is supported by the slot 34b having a height different from the heights of the slots 34a and 34c (the region near the right end of the transfer target object W on the drawing sheet surface is not floating in the air) is also an aspect of the cross abnormal mounting.

As described above, in the mapping mechanism M of the present embodiment, the mapping sensors M1 and M2 having the predetermined detection target areas TA and TB are configured to detect the end surface Wa of the transfer target object W to determine whether the accommodation state of the transfer target object W is good or bad.

Further, in the mapping mechanism M of the present embodiment, the thickness of the transfer target object W is also calculated based on the duration of signal reception (duration of signal ON) of the mapping sensors M1 and M2. When the mapping arm Mt is moved up and down by the stepping motor, the thickness of the transfer target object W is also calculated based on the number of pulses of the stepping motor from the duration of signal reception (duration of signal ON) of the mapping sensors M1 and M2. In the present embodiment, in order to improve the processing efficiency, only the duration of signal ON of the first mapping sensor M1 is measured, and the duration of signal ON of the second mapping sensor M2 is not measured. This is focused on the fact that whether or not multiple transfer target objects W are accommodated in an overlapped state can be identified from the thickness of the accommodated transfer target objects W in at least one location.

The load port 1 of the present embodiment executes a predetermined operation by giving a drive command from the controller 1C to each part and each mechanism. The controller 1C is configured to include a memory part, a ROM, a RAM, an I/O port, a CPU, an input/output interface (IF) for inputting and outputting data with respect to an external display device or the like, and a bus configured to connect these parts to each other to transmit information between the respective parts.

A control procedure (operation sequence) is stored in the memory part according to the type of processing executed by the load port 1. That is, a predetermined operation program is stored in the memory part. The program used in the present embodiment is stored as an executable program in a non-transitory computer-readable recording medium (a hard disk or the like).

The ROM is a recording medium composed of a hard disk, an EEPROM, a flash memory, etc., and configured to store an operation program of the CPU, and the like. The RAM functions as a work area of the CPU, and the like. The I/O port, for example, outputs a control signal outputted by the CPU to each part and each mechanism, and supplies information from various sensors to the CPU.

The CPU constitutes the core of the controller 1C and executes an operation program stored in the ROM. The CPU controls the operation of the load port 1 according to the program stored in the memory part.

Figure 6:
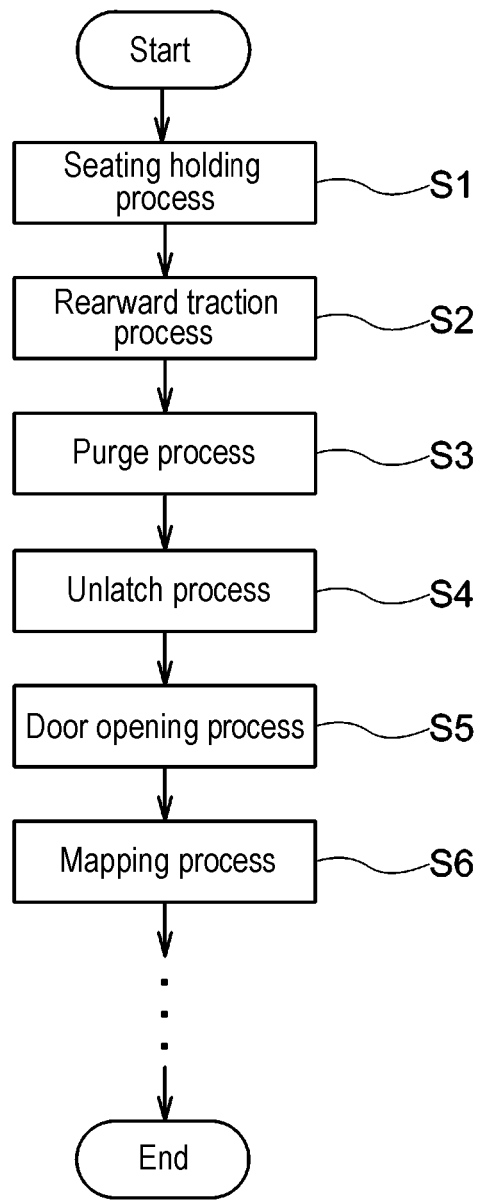
FIG. 6 is a flowchart showing an operation procedure of the load port shown in FIG. 1.

Next, a method of using the load port 1 (particularly, a mapping processing method) and an operation of the load port 1 of the present embodiment will be described with reference to FIG. 6 showing an operation flow.

First, when the storage container 3 is transferred to above the load port 1 and mounted on the mounting table 5 by an automatic storage container transfer device such as an OHT or the like that operates on a straight transfer line (traffic line) extending along a common wall surface 2F on which the load port 1 is arranged in the transfer chamber 2, in the load port 1 of the present embodiment, a seating holding process S1 is executed in which the controller 1C causes the seating holding mechanism 6 to hold the storage container 3 on the mounting table 5 (see FIG. 6). Specifically, the seating holding process Si in the present embodiment is a process in which the locking claws on the mounting table 5 are hooked and locked to the locked portions (not shown) provided on the bottom surface of the storage container 3 or the bottom surface of the frame cassette C. As a result, the storage container 3 or the frame cassette C can be mounted and fixed at a predetermined seating position on the mounting table 5. When the storage container 3 is mounted on the mounting table 5, the positioning protrusions 51 provided on the mounting table 5 fit into the positioning recesses of the storage container 3.

In the present embodiment, the storage container 3 can be mounted on the mounting table 5 of each of the three load ports 1 arranged side by side in the width direction of the transfer chamber 2. A seating sensor (not shown) for detecting whether or not the storage container 3 is mounted at a predetermined position on the mounting table 5 is configured to detect that the storage container 3 is mounted at the seating position on the mounting table 5.

Following the seating holding process S1, in the load port 1 of the present embodiment, the controller 1C causes the traction mechanism 7 to retract the mounting table 5 from the seating position to the transfer target object delivery position toward the frame 4 (rearward traction process S2). By this rearward traction process S2, the container door 33 can be connected (docked) to the load port door 8 waiting at the fully closed position in advance and can be held in close contact with the load port door 8. In the present embodiment, the container door 33 is connected to and brought into close contact with the load port door 8 by using the engaging portion 81 provided on the load port door 8.

In the load port 1 of the present embodiment, when the storage container 3 is mounted at the seating position on the mounting table 5, the controller 1C detects that, for example, a pressure sensor provided on the mounting table 5 is pressed by the bottom surface portion of the storage container 3. With this as a trigger, the controller 1C gives a drive command (signal) to cause the bottom purge injection nozzle and the bottom purge discharge nozzle provided on the mounting table 5 to move upward beyond the upper surface of the mounting table 5. As a result, these nozzles (the bottom purge injection nozzle and the bottom purge discharge nozzle) are connected to the injection port and the discharge port of the storage container 3, respectively, so that a purge process can be executed.

Then, in the load port 1 of the present embodiment, a purge process S3 is executed in which the controller 1C issues a drive command to execute a purge process S3 for the internal space 3S of the storage container 3. This purge process S3 is a process in which a predetermined environmental gas is supplied from the bottom purge injection nozzle to the internal space 3S of the storage container 3 through the injection port, and the gas staying in the internal space 3S of the storage container 3 is discharged from the bottom purge discharge nozzle through the discharge port. By this purge process S3, the internal space 3S of the storage container 3 is filled with the environmental gas, and the water concentration and the oxygen concentration in the storage container 3 are lowered to a predetermined value or less in a short time, which makes it possible to convert the surrounding environment of the transfer target object W in the storage container 3 into a low humidity environment and a low oxygen environment.

It may be possible to use a storage container 3 that has been purged in advance before it is mounted on the mounting table 5. Such a storage container 3 may be or may not be subjected to the purge process S3.

Subsequently, in the load port 1 of the present embodiment, a process (unlatch process S4) is executed which the controller 1C causes the connection switching mechanism 82 to release the engagement state between the container door 33 and the container body 32 to establish an unlatch state so that the container door 33 can be removed from the container body 32.

Following the unlatch process S4, in the load port 1 of the present embodiment, a process (door opening process S5) is executed in which the controller 1C causes the door opening/closing mechanism 9 to move the load port door 8 rearward from the fully closed position to the door opening position to open the opening 41 of the frame 4. Specifically, the controller 1C causes the door opening/closing mechanism 9 to move the load port door 8 from the fully closed position to the door opening position along the above-mentioned horizontal route. At this time, the load port door 8 moves while integrally holding the container door 33 by the engaging portion 81. Therefore, by the door opening process S5, the loading/unloading port 31 of the storage container 3 is also opened in a similar manner as the opening 41 of the frame 4.

Next, in the load port 1 of the present embodiment, the controller 1C causes the mapping mechanism M to execute a mapping process S6. The mapping process S6 is a process in which, while moving the mapping arm Mt in the height direction at a constant speed, the mapping sensors M1 and M2 acquire information about the transfer target object W in the storage container 3 for each slot 34. In the present embodiment, the height position of the mapping sensors M1 and M2 immediately after the door opening process S5 is set to a position slightly above the uppermost slot 34 in the storage container 3. The height position of the mapping sensors M1 and M2 is defined as a mapping start height position. According to the load port 1 of the present embodiment described above, it is possible to execute the mapping process S6 immediately after the door opening process S5. Since the load port 1 of the present embodiment executes the door opening process S5 before the mapping process S6, the opening 41 of the frame 4 and the loading/unloading port 31 of the storage container 3 are kept in an open state.

Then, in the load port 1 of the present embodiment, when the load port door 8 is moved downward from the door opening position to the fully opened position by the door opening/closing mechanism 9, the entire mapping mechanism M is also moved downward. As a result, the two mapping sensors M1 and M2 are moved from the mapping start height position to the position lower than the lowest slot 34 (mapping end height position) while being maintained at appropriate positions where the mapping process S6 can be executed. The controller 1C executes a sensing process for detecting the presence or absence of signal reception for each of the mapping sensors M1 and M2 through the above procedure.

In the present embodiment, at the same timing as the sensing process performed by predetermined one (the first mapping sensor M1 in the present embodiment) of the two mapping sensors M1 and M2, a sensing process is performed by the remaining mapping sensor (the second mapping sensor M2). As described above, in the present embodiment, the first mapping sensor M1 is caused to function as a main mapping sensor, and the second mapping sensor M2 is caused to function as a sub-mapping sensor that operates in synchronization with the main mapping sensor. The controller 1C executes the mapping process S6 in which the good/bad of the accommodation state including the presence or absence of the transfer target object W is identified by the determination part M5 for each slot 34 based on the detection signals generated in the sensing process.

The specific determination method in the determination part MT is as described above. In the mapping process S6, it is possible to identify whether the accommodation state of the transfer target object W in the slots 34 to be determined is normal mounting, cross abnormal mounting, or non-mounting (empty slot). Further, in the load port 1 of the present embodiment, in the mapping process S6, the controller 1C causes the mapping mechanism M to calculate the thickness of the transfer target object W based on the duration of signal reception (duration of signal ON) by the mapping sensor (the first mapping sensor M1 as a main mapping sensor in the present embodiment). Based on the calculation result, the controller 1C causes the determination part MT to identify whether or not multiple transfer target objects W are accommodated in an overlapped state. That is, when the duration of signal reception is equal to or longer than a predetermined time, the determination part MT identifies that multiple transfer target objects W are accommodated in an overlapped state (double abnormal mounting).

In the load port 1 of the present embodiment, based on the result of the mapping process S6, the controller 1C executes a process in which the transfer target objects W stored in the normal posture are sequentially transferred by the transfer robot 21 to a predetermined transfer destination (the processing chamber R (specifically, the load lock chamber), the buffer station, the aligner, etc.).

On the other hand, when it is identified based on the detection result in the mapping process S6 that the transfer target object W, which is not stored in the normal posture, is accommodated (when the cross abnormal mounting or the double abnormal mounting is identified), the storage container 3 on the mounting table 5 is delivered from the mounting table 5 to another space by the automatic storage container transfer device. Therefore, it is possible to avoid a situation such as damage or breakage of the transfer target object W which may occur when the transfer target object W in the state of cross abnormal mounting is transferred by the transfer robot 21. When a new storage container 3 is mounted on the mounting table 5 by the automatic storage container transfer device, the operation sequence described above is performed.

According to the load port 1 of the present embodiment described above, the mapping process S6 can be executed by using the mapping mechanism M that maps the information on the accommodation state including the presence or absence of the transfer target object W in each slot 34 in the storage container 3. The information on the accommodation state including the presence or absence of the transfer target object W in each slot 34 in the storage container 3 can be mapped in the mapping process S6. Based on the detection result in the mapping process S6, it is possible to identify normal mounting, cross abnormal mounting, or double abnormal mounting of the transfer target object W.

As described above, the load port 1 of the present embodiment includes: a frame 4 including an opening 41 via which a transfer target object W can pass in a substantially horizontal posture; a load port door 8 configured to engage with a container door 33 capable of opening and closing a loading/unloading port 31 of a storage container 3 including slots 34 for accommodating the transfer target object W in a multi-stage manner and configured to open and close the opening 41 of the frame 4; and a mapping mechanism M configured to map information on an accommodation state including the presence or absence of the transfer target object W in each of the slots 34 in the storage container 3 via the opening 41 and the loading/unloading port 31, wherein the mapping mechanism M includes two mapping sensors M1 and M2 configured to move up and down integrally with or independently of the ascending/descending movement of the load port door 8 when opening and closing the opening 41 and capable of detecting an end surface Wa of the transfer target object W by irradiating detection waves toward the inside of the storage container 3, and a determination part MT configured to determine whether the accommodation state of the transfer target object W is good or bad based on sensing information obtained by the two mapping sensors M1 and M2.

According to the load port 1 of the present embodiment, it is possible for the mapping mechanism M including two mapping sensors M1 and M2 to map information on the accommodation state including the presence or absence of the transfer target object W in each slot 34 in the storage container 3.

Therefore, in the case of the load port 1 of the present embodiment, even for a large thin transfer target object having a rectangular plan-view shape and having a linear end surface extending over substantially the entire opening width at the loading/unloading port 31 of the storage container 3, it is possible for the two mapping sensors M1 and M2 to detect the accommodation state of the transfer target object W in the storage container 3 accurately and correctly.

Moreover, in the case of the load port 1 of the present embodiment, it is possible for the mapping mechanism M to map the information on the accommodation state including the presence or absence of the transfer target object W in each slot 34 in the storage container 3 without imaging and image processing. As compared with an image processing system using a camera or the like, it is possible to speed up the process of detecting the transfer target object W, and it is possible to keep the cost of the system low.

Further, in the load port 1 of the present embodiment, the detection target area TA of the first mapping sensor M1 of the two mapping sensors M1 and M2 arranged side by side in the horizontal direction is set at one end portion of the loading/unloading port 31. Then, the detection target area TB of the second mapping sensor M2 is set at the other end portion of the loading/unloading port 31.

According to the load port 1 of the present embodiment, the two mapping sensors M1 and M2 are arranged side by side on the common mapping arm Mt so as to be horizontally spaced apart from each other, and one end side portion and the other end side portion of the end surface of the transfer target object W facing the loading/unloading port 31 are detected by the two mapping sensors M1 and M2, respectively. Therefore, as compared with the case where the two detection target areas are set only at one end side portion or only at the other end side portion of the loading/unloading port 31 of the storage container 3, it is possible for the determination part MT to reliably identify that the transfer target object W is accommodated in the horizontal posture, based on the sensing information obtained by the two mapping sensors M1 and M2.

Second Embodiment

The load port 101 of the present embodiment differs from the load port 1 of the first embodiment in that unlike the circular beam shape of the mapping sensors M1 and M2 of the first embodiment, the mapping sensors M101 and M102 of the present embodiment has a strip-like beam shape, and in terms of the method of identifying whether the accommodation state of the transfer target object W is good or bad. The same configurations of the load port 101 of the present embodiment as those of the load port 1 of the first embodiment will not be described in detail.

Figure 7:
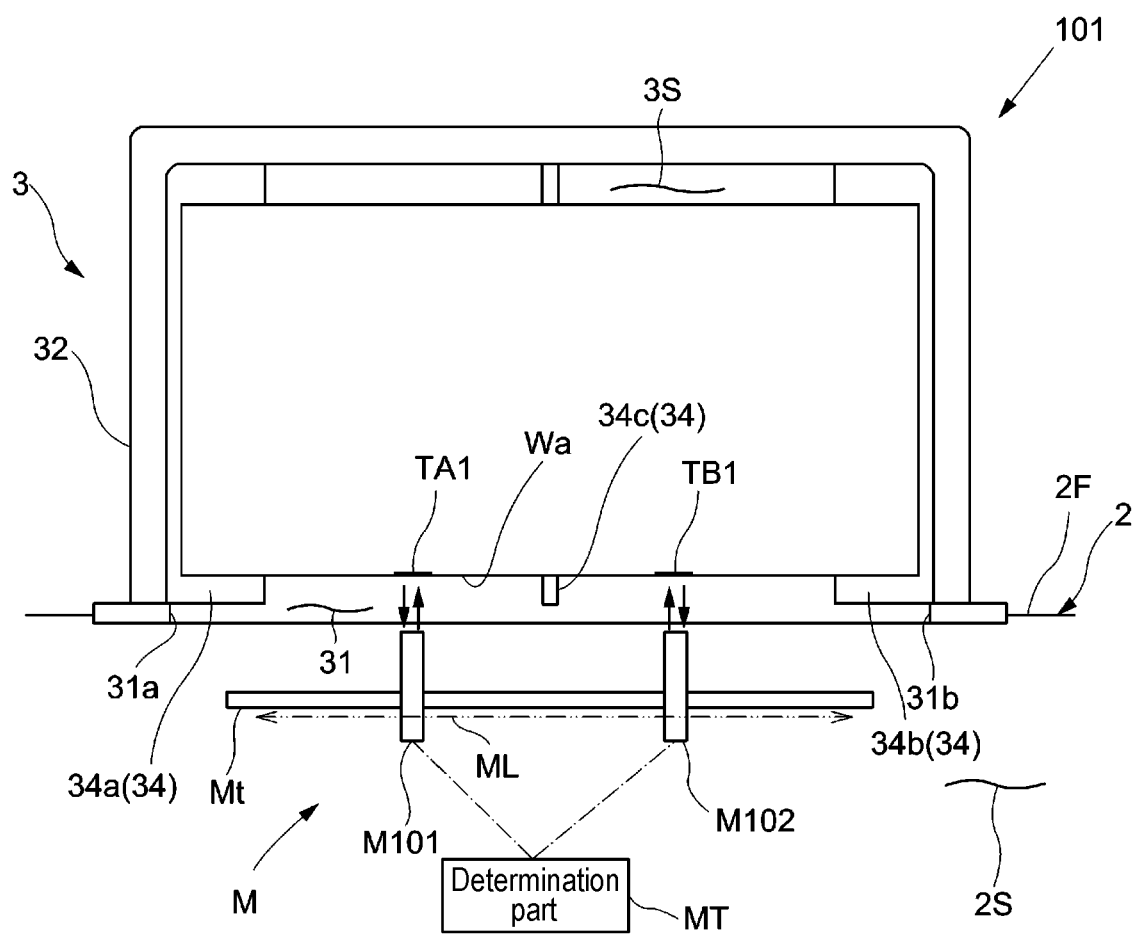
FIG. 7 is a diagram schematically showing the relative positional relationship between a transfer target object accommodated in a slot in a storage container and a mapping mechanism in a load port according to a second embodiment of the present disclosure.

In the load port 101 of the present embodiment, as shown in FIG. 7, the mapping mechanism M includes two mapping sensors M101 and M102 configured to detect the presence or absence of the transfer target object W stored in a multi-stage manner in the height direction H by each slot (multi-stage slot) 34 provided in the storage container 3, a mapping arm Mt configured to support the two mapping sensors M101 and M102 at the same height position, and a determination part MT configured to determine whether the accommodation state of the transfer target object W is good or bad, based on the sensing information obtained by the two mapping sensors M101 and M102, whereby the presence or absence and storage posture of the transfer target object W in the storage container 3 can be detected.

The mapping sensors M101 and M102 function as end surface detection parts capable of detecting the end surface Wa of the transfer target object W. In the present embodiment, as the mapping sensors M101 and M102, it may be possible to use photoelectric sensors capable of acquiring an output signal (sensing information) by irradiating light such as visible light or infrared light from a light emitting part and detecting a change in the amount of light reflected or blocked by the transfer target object W as a detection object using a light receiving part. Particularly, in the present embodiment, a reflection type photoelectric sensor (reflection type sensor) in which a transmitter (light emitting sensor or light emitting element) for emitting a strip-shaped beam (linear light) extending along the end surface Wa of the transfer target object W and a receiver (light receiving sensor or light receiving element) for receiving the beam emitted from the light emitting element and reflected by the end surface Wa of the transfer target object W are built in one sensor amplifier is used.

Figure 8A:
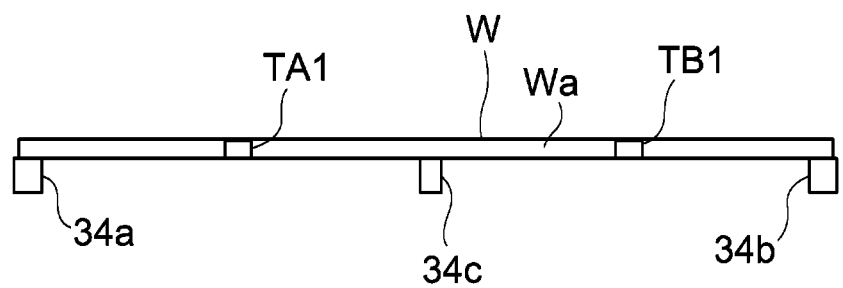
FIGS. 8A and 8B are diagrams schematically showing a detection target area of the mapping sensor in the load port shown in FIG. 7.
Figure 8B:
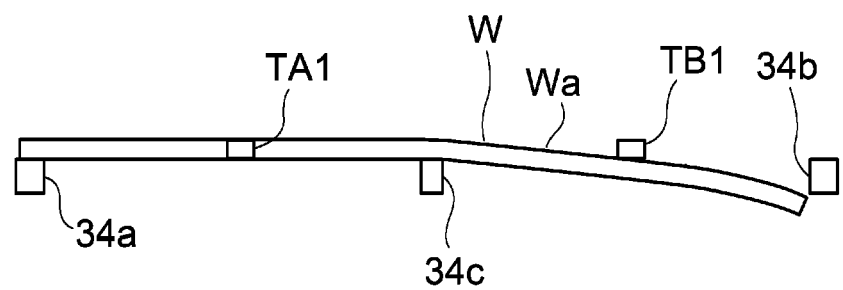

As shown in FIG. 8A, the detection target areas TA1 and TB1 of the mapping sensors M101 and M102 are the irradiation areas of the sensor light indicated in a rectangular shape, particularly the irradiation areas having the height (length in the vertical direction) substantially equal to the thickness of one transfer target object W as a detection target and the width (length in the horizontal direction) along the end surface Wa of the transfer target object W. The detection target areas TA1 and TB1 have a horizontally elongated shape so that the width along the end surface Wa of the transfer target object W is larger than the height. When detecting the end surface Wa of the transfer target object W having a thickness of, for example, 0.4 to 3 mm, the height of the irradiation area is, for example, 0.2 mm, and the width along the end surface Wa of the transfer target object W is, for example, 1.5 mm. In particular, it is preferable to set the height of the irradiation area within the range of 0.05 to 0.2 mm and the width of the irradiation area within the range of 1 mm to 1.5 mm.

The mapping mechanism M controls the ascending/descending movement of the mapping arm Mt by a stepping motor 110. Therefore, the mapping arm Mt moves up and down independently of the ascending/descending movement of the load port door 8. That is, it may be possible to appropriately select whether or not the mapping sensors M101 and M102 of the mapping mechanism M share an elevating mechanism with the load port door 8.

Figure 9:
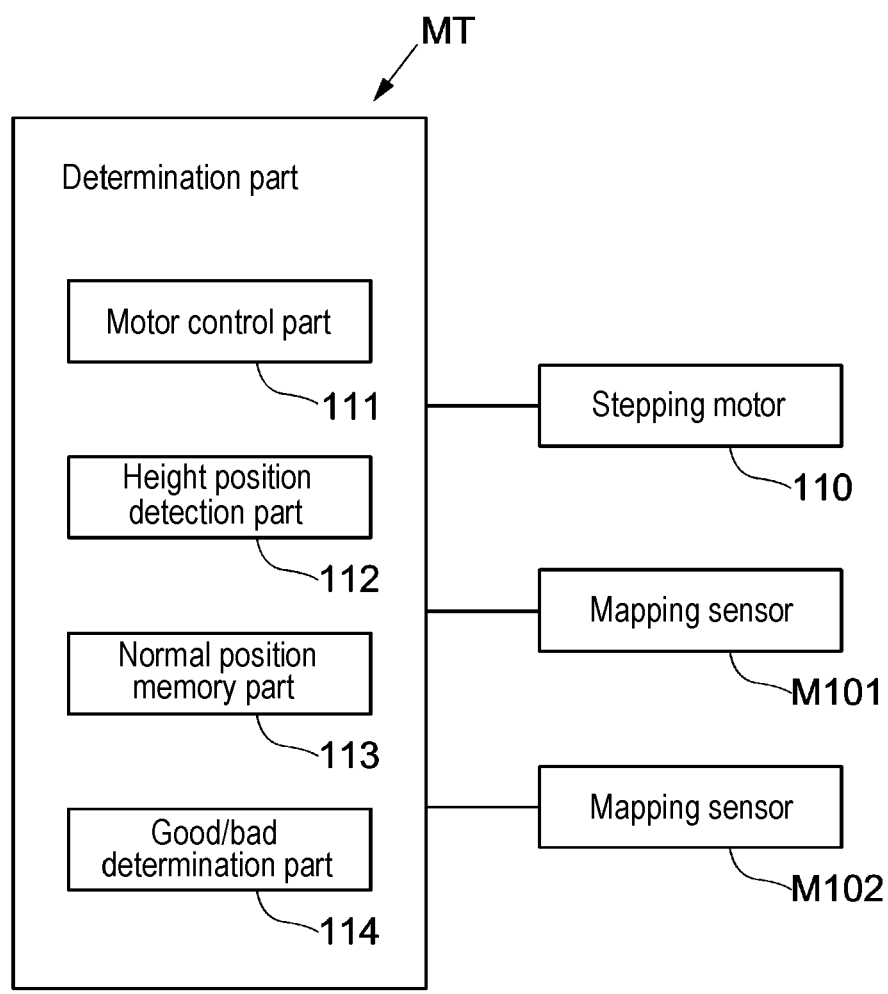
FIG. 9 is a diagram showing a control block of the load port shown in FIG. 7.

As shown in FIG. 9, the determination part MT includes a motor control part 111, a height position detection part 112, a normal position memory part 113, and a good/bad determination part 114. The stepping motor 110 and the mapping sensors M101 and M102 are connected to the determination part MT. The determination part MT is formed inside, for example, the controller 1C.

Figure 10:
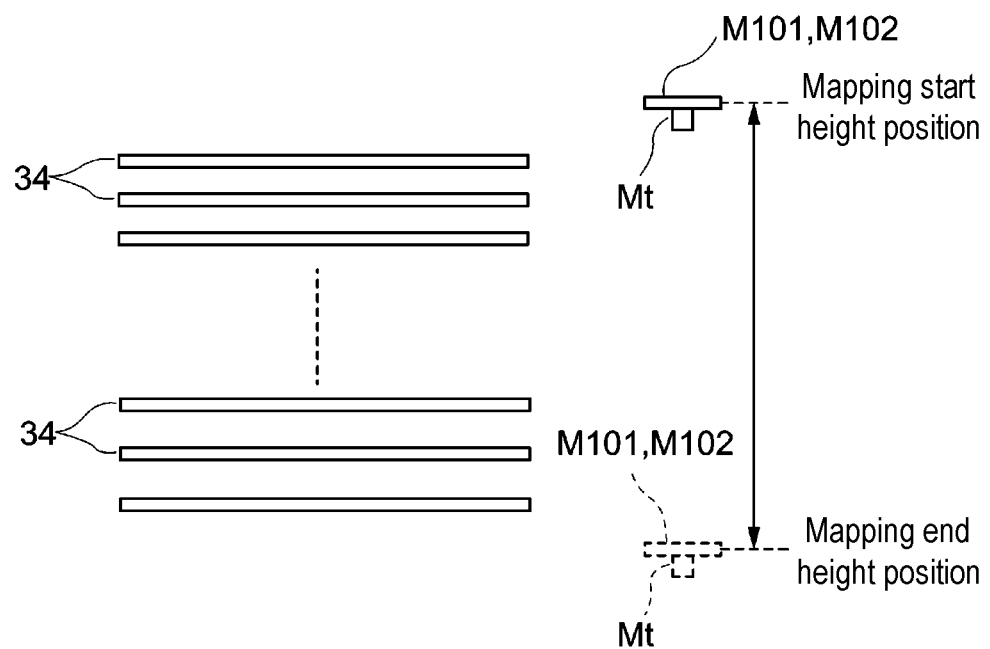
FIG. 10 is a diagram showing an ascending/descending range of the mapping sensor in the load port shown in FIG. 7.

As shown in FIG. 10, when performing a mapping process, the motor control part 111 controls the stepping motor 110 so as to lower the mapping arm Mt from the mapping start height position. The amount of downward movement of the mapping arm Mt is determined according to the number of pulses inputted to the stepping motor 110 from the motor control part 111.

In a state in which the mapping arm Mt remains in the mapping start height position, the height position detection part 112 detects the descending distance of the mapping sensor M101 from the mapping start height position based on the number of pulses inputted to the stepping motor 110 from the motor control part 111. That is, the height position detection part 112 detects the height position of the mapping sensor M101. The height position detection part 112 of the present embodiment detects the height position of the transfer target object W (the height position of the detection target area TA obtained by the mapping sensor M101) based on the sensing information of the mapping sensor M101.

Figure 11A:
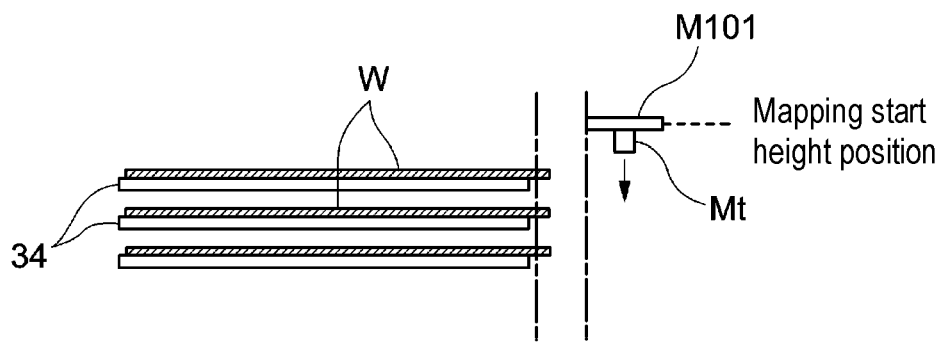
FIGS. 11A, 11B and 11C are diagrams illustrating a method of detecting a height position of the mapping sensor in the load port shown in FIG. 7.
Figure 11B:
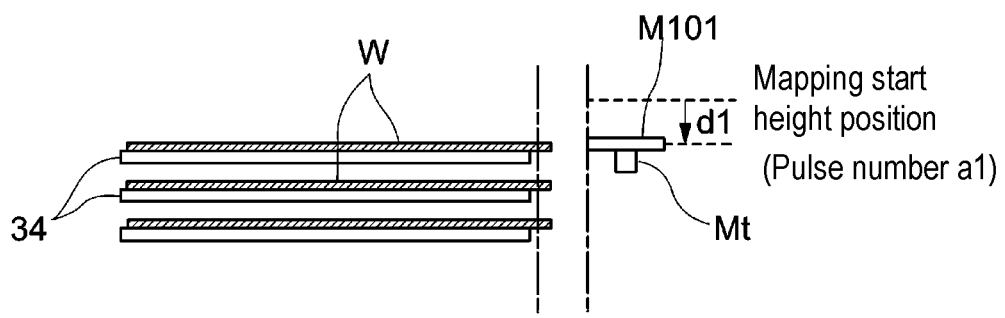

For example, it is considered that when the pulse number a1 is inputted to the stepping motor 110 from the motor control part 111 in a state in which the mapping arm Mt remains at the mapping start height position as shown in FIG. 11A, the end surface Wa of the transfer target object W in the uppermost slot 34 in the storage container 3 is detected as shown in FIG. 11B. At this time, until the end surface Wa of the transfer target object W is detected by the mapping sensors M101 and M102, the height position detection part 112 detects, based on the pulse number a1 inputted to the stepping motor 110, that the mapping sensors M101 and M102 are located at the position lowered from the mapping start height position by the distance d1 corresponding to the pulse number a1.

Figure 11C:
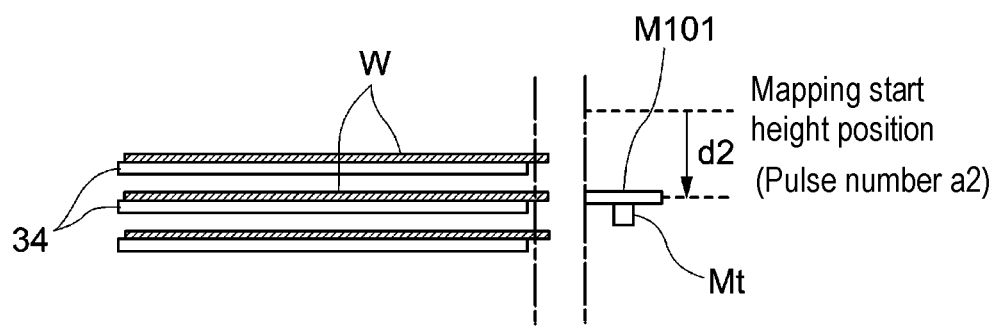

Similarly, when the pulse number a2 is inputted to the stepping motor 110 from the motor control part 111, if the end surface Wa of the transfer target object W in the second slot 34 from the top in the storage container 3 is detected as shown in FIG. 11C, until the end surface Wa of the transfer target object W is detected by the mapping sensors M101 and M102, the height position detection part 112 detects, based on the pulse number a2 inputted to the stepping motor 110, that the mapping sensors M101 and M102 are located at the position lowered from the mapping start height position by the distance d2 corresponding to the pulse number a2.

The normal position memory part 113 stores a normal height position of the transfer target object W at which the transfer target object W is placed in each slot 34 in the storage container 3 in a normal storage posture. In the present embodiment, the normal position memory part 113 stores the downward distance of the mapping arm Mt from the mapping start height position as the normal height position of the transfer target object W.

Figure 12:
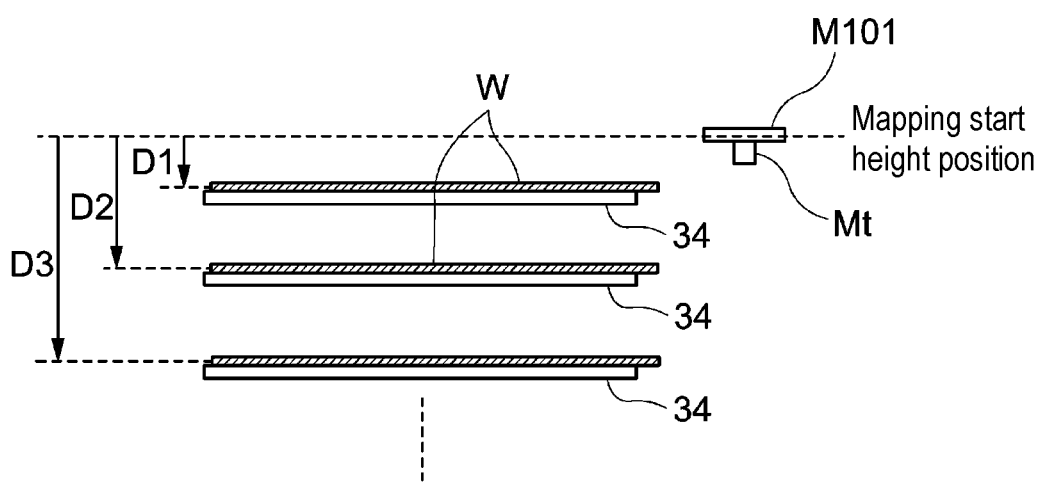
FIG. 12 is a diagram illustrating a normal height position of a transfer target object arranged on each slot in the load port shown in FIG. 7.

For example, the normal height position of the transfer target object W arranged in the normal storage posture in the uppermost slot 34 in the storage container 3 is a height position spaced apart downward by a distance D1 from the mapping start height position of the mapping arm Mt as shown in FIG. 12. Similarly, the normal height positions of the transfer target objects W arranged in the normal storage posture in the second slot 34 from the top and the third slot 34 from the top are height positions spaced apart downward from the mapping start height position of the mapping arm Mt by distances D2 and D3, respectively. The same applies to the normal height positions of the transfer target objects W arranged in the normal storage posture in the slots 34 below the fourth slot 34 from the top.

The good/bad determination part 114 determines the good/bad of the accommodation state of the transfer target object W based on the sensing information obtained by the two mapping sensors M101 and M102.

First, when the end surface Wa of the transfer target object W in the slot 34 is detected in the detection target area TA of the mapping sensor M101, the good/bad determination part 114 determines whether or not the portion of the end surface Wa of the transfer target object W in the detection target area TA is located at the normal height position, by comparing the height position of the mapping sensor M101 detected by the height position detection part 112 at that time with the normal height position of the transfer target object W in each slot 34.

That is, when the height position of the mapping sensor M101 detected by the height position detection part 112 and the normal height position stored in the normal position memory part 113 for each slot 34 match, the good/bad determination part 114 determines that the portion of the end surface Wa of the transfer target object W in the detection target area TA is located at the normal height. On the other hand, when the height position of the mapping sensor M101 detected by the height position detection part 112 and the normal height position stored in the normal position memory part 113 for the slot 34 do not match, the good/bad determination part 114 determines that the portion of the end surface Wa of the transfer target object W in the detection target area TA is not located at the normal height.

Thereafter, when it is determined that the portion of the end surface Wa of the transfer target object W in the detection target area TA is located at the normal height, if the end surface Wa of the transfer target object W is detected by the mapping sensor M101, the good/bad determination part 114 determines whether or not the end surface Wa of the transfer target object W is detected by the mapping sensor M102. That is, if the end surface Wa of the transfer target object W exists in the detection target area TA of the mapping sensor M101, the good/bad determination part 114 determines whether or not the end surface Wa of the transfer target object W exists in the detection target area TB of the mapping sensor M102.

As described above, when the portion of the end surface Wa of the transfer target object W in the detection target area TA is located at the normal height and the end surface Wa of the transfer target object W is present in the detection target area TA of the mapping sensor M101, if the end surface Wa of the transfer target object W exists in the detection target area TB of the mapping sensor M102, the determination part MT (good/bad determination part 114) identifies that the transfer target object W is accommodated in the normal posture (horizontal posture).

When the end surface Wa of the transfer target object W is detected by the mapping sensor M101 and the portion of the end surface Wa of the transfer target object W in the detection target area TA is not located at the normal height, the determination part MT (good/bad determination part 114) identifies that the transfer target object W is not accommodated in the normal posture (horizontal posture).

When the end surface Wa of the transfer target object W is not detected by the mapping sensor M101, the determination part MT (good/bad determination part 114) identifies that the transfer target object W is not accommodated.

As described above, according to the load port 101 of the present embodiment, information on the accommodation state including the presence or absence of the transfer target object W in each slot 34 in the storage container 3 can be mapped by the mapping mechanism M including two mapping sensors M101 and M102.

Further, in the load port 101 of the present embodiment, the determination part MT determines whether or not the transfer target object W is located at the normal height position in each slot 34, by detecting the height position of the transfer target object W based on the sensing information of the mapping sensor M101 and comparing the detected height position with the normal height position of the transfer target object W in each slot 34.

According to the load port 101 of the present embodiment, the height position of the transfer target object W can be detected based on the sensing information of the mapping sensor M101. Therefore, it is possible to reliably detect whether or not the transfer target object W in each slot 34 in the storage container 3 is located at the normal position.

Further, in the load port 101 of the present embodiment, the beam irradiated from the two mapping sensors M101 and M102 has a strip shape extending along the end surface Wa of the transfer target object W.

According to the load port 101 of the present embodiment, the end surface Wa of the transfer target object W can be reliably detected by the beam radiated from the two mapping sensors M101 and M102 without being easily affected by disturbance.

Third Embodiment

The load port 201 of the present embodiment differs from the load port 1 of the first embodiment in that the mapping sensor M102 is used as a pop-out sensor, and in terms of the method of identifying whether the accommodation state of the transfer target object W is good or bad. The same configurations of the load port 201 of the present embodiment as those of the load port 1 of the first embodiment will not be described in detail.

In the load port 201 of the present embodiment, in a similar manner as the second embodiment, the mapping mechanism M includes two mapping sensors M101 and M102 configured to detect the presence or absence of the transfer target object W stored in a multi-stage manner in the height direction H by each slot (multi-stage slot) 34 provided in the storage container 3, a mapping arm Mt configured to support the two mapping sensors M101 and M102 at the same height position, and a determination part MT configured to determine whether the accommodation state of the transfer target object W is good or bad, based on the sensing information obtained by the two mapping sensors M101 and M102. The mapping mechanism M is capable of detecting the presence or absence and accommodation posture of the transfer target object W in the storage container 3.

The mapping mechanism M of the present embodiment performs sensing to detect the pop-out of the transfer target object W stored in the storage container 3 by using the mapping sensor M102 before starting the sensing to determine the good/bad of the accommodation state of the transfer target object W by the two mapping sensors M101 and M102.

That is, in the present embodiment, if the transfer target object W accommodated in the storage container 3 is located at a position popped out from the normal position in the storage container 3 during a mapping process, the two mapping sensors M101 and M102 may collide with the transfer target object W. Although the load port 1 of the first embodiment includes a sensor different from the mapping sensors M101 and M102 of the mapping mechanism M as the pop-out sensor, the mapping sensor M102 of the mapping mechanism M is used to detect the pop-out of the transfer target object W, in the present embodiment.

In the load port 201 of the present embodiment, the mapping arm Mt is configured to move between an unmappable position at which the mapping arm Mt is retracted closer to the transfer chamber side R than the frame 4 of the load port 201 and a mappable portion at which the mapping arm Mt is moved closer to the inside of the storage container 3 than the unmappable position via the opening 41 of the frame 4.

Figure 13A:
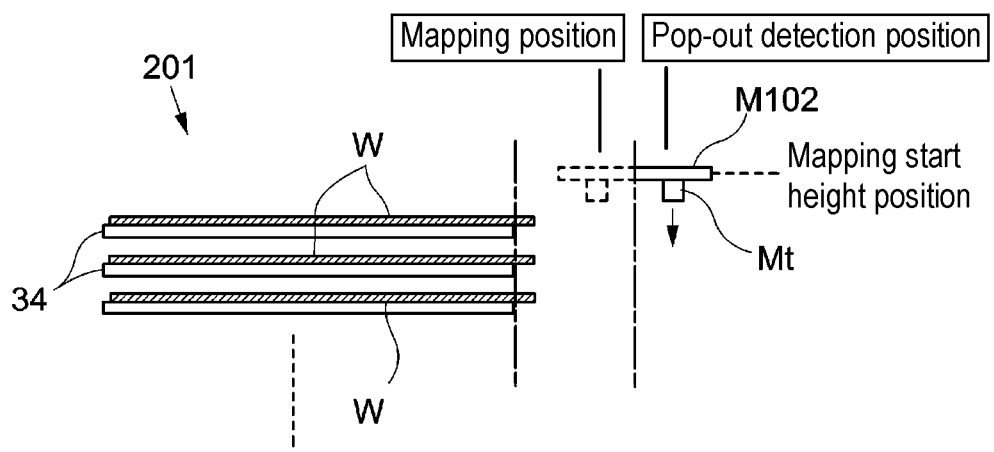
FIGS. 13A, 13B and 13C are diagrams illustrating a method of moving a mapping sensor in a load port according to a third embodiment of the present disclosure.

When the mapping arm Mt is located at the mappable portion, as shown in FIG. 13A, the mapping sensors M101 and M102 are arranged at a mapping position where the mapping sensor M101 and M102 move downward while performing mapping. On the other hand, when the mapping arm Mt is located at the unmappable position, the mapping sensors M101 and M102 are arranged at a pop-out detection position behind the mapping position. In the present embodiment, only the mapping sensor M102 of the mapping sensors M101 and M102 is used to detect the pop-out of the transfer target object W stored in the storage container 3.

Figure 13B:
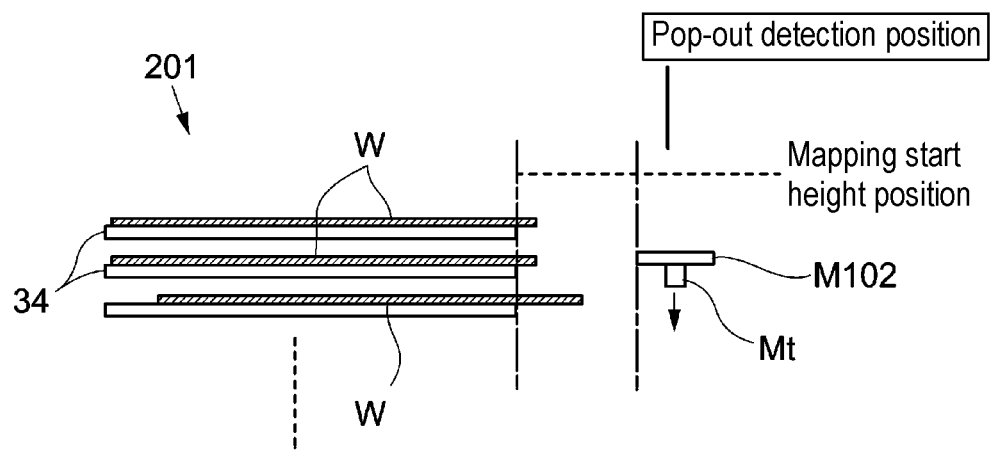

In the load port 201 of the present embodiment, the mapping sensor M102 is moved downward from the mapping start height position while the mapping sensor M102 is located at the pop-out detection position. Since the transfer target object W in the uppermost slot 34 and the transfer target object W in the second slot 34 from the top in the storage container 3 are not located at the popped-out positions as shown in FIG. 13B, the mapping sensor M102 does not detect the end surfaces Wa of those transfer target objects W.

Figure 13C:
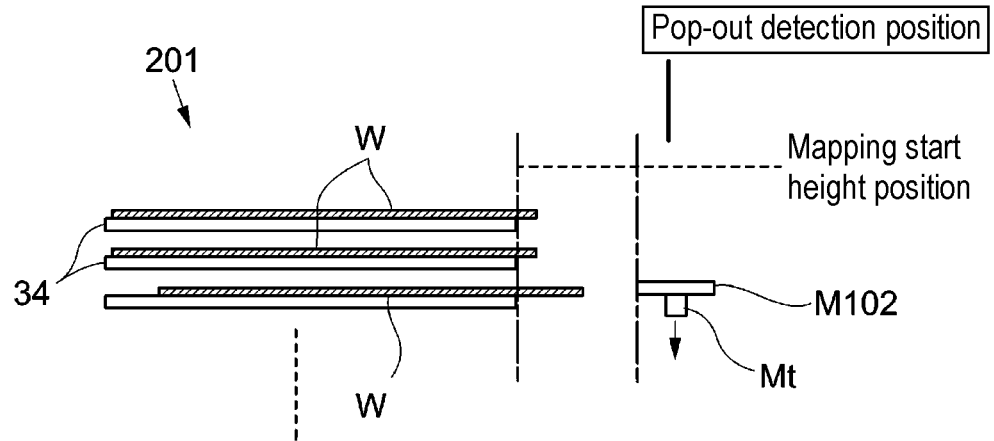

On the other hand, when the transfer target object W in the third slot 34 from the top in the storage container 3 is located at the popped-out position as shown in FIG. 13C, the mapping sensor M102 detects the end surface Wa of the transfer target object W.

In the present embodiment, it is necessary to set the detection range of the mapping sensor M102 so that when the mapping sensor M102 is moved downward from the mapping start height position in the state of being arranged at the pop-out detection position, the mapping sensor M102 does not detect the end surface Wa of the transfer target object W located at the normal position (not located at the popped-out position) in the slot 34 but detect the end surface Wa of the transfer target object W located at the popped-out position in the slot 34. The distance between the mapping position and the pop-out detection position is adjusted.

Figure 14A:
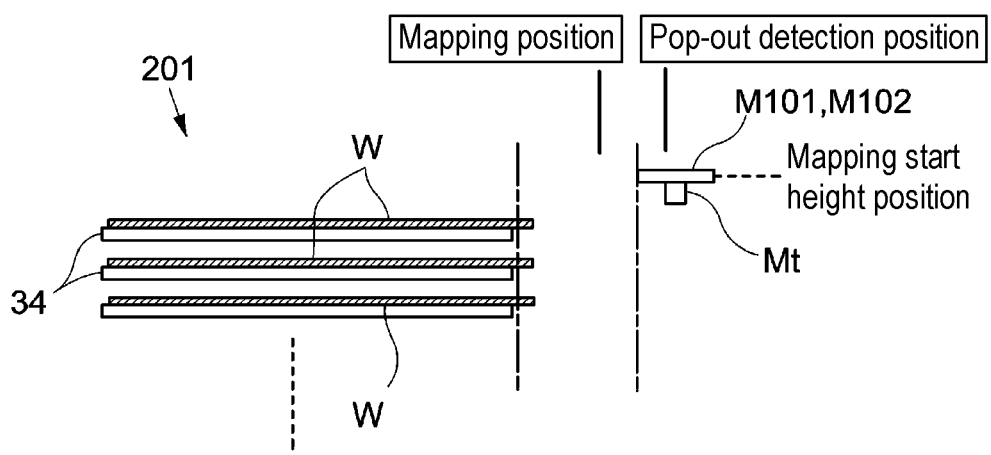

After moving the mapping sensor M102 to the mapping end height position and detecting that the transfer target object W in each slot 34 is not popped out in the storage container 3, the mapping arm Mt is moved up to the mapping start height position as shown in FIG. 14A.

Figure 14B:
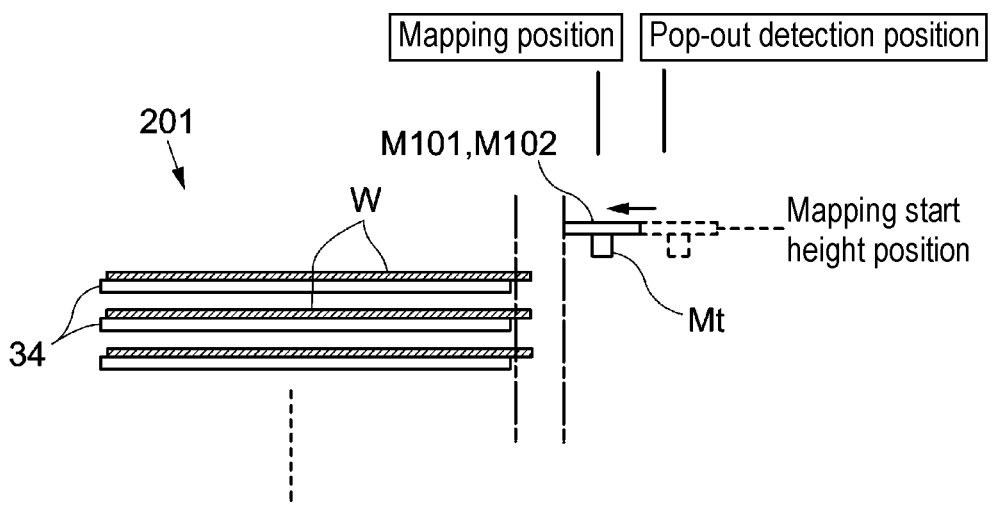

In that state, as shown in FIG. 14B, when the mapping arm Mt is moved to a mappable position close to the storage container 3, the mapping sensors M101 and M102 are arranged at the mapping position. Thereafter, as shown in FIG. 14C, while the mapping sensors M101 and M102 are located at the mapping position, the mapping sensors M101 and M102 are moved downward from the mapping start height position to perform a mapping process. The mapping processing method of the present embodiment is the same as the mapping processing method of the second embodiment.

As described above, according to the load port 201 of the present embodiment, information on the accommodation state including the presence or absence of the transfer target object W in each slot 34 in the storage container 3 can be mapped by the mapping mechanism M including two mapping sensors M101 and M102.

Further, in the load port 201 of the present embodiment, the mapping mechanism M performs sensing to detect the pop-out of the transfer target object W stored in the storage container 3 by using the mapping sensor M102 before starting the sensing to determine the good/bad of the accommodation state of the transfer target object W by the two mapping sensors M101 and M102.

According to the load port 201 of the present embodiment, the pop-out of the transfer target object W stored in the storage container 3 is detected by using the mapping sensor M102. Therefore, it is not necessary to separately provide a sensor for detecting the pop-out of the transfer target object W. This makes it possible to reduce the manufacturing cost.

The present disclosure is not limited to the above-described embodiments.

In the first embodiment, when the end surface Wa of the transfer target object W exists in the detection target areas TA and TB of the two mapping sensors M1 and M2, the determination part MT identifies that the transfer target object W is accommodated in the normal posture (horizontal posture). However, the method in which the determination part MT identifies that the transfer target object W is accommodated in the normal posture is arbitrary. The same also applies to the second and third embodiments.

For example, the determination part MT may determine whether the transfer target object W is accommodated in the normal posture (horizontal posture), based on the interval of signal ON outputted when each of the two mapping sensors M1 and M2 detects the end surface Wa of the transfer target object W.

Figure 15A:
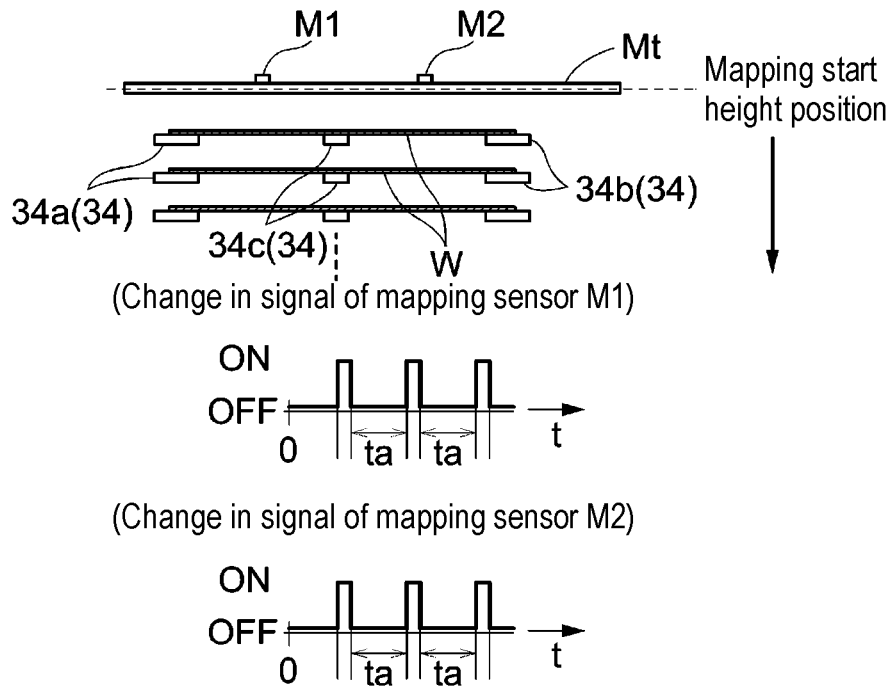
FIGS. 15A and 15B are diagrams showing a modification of a method of determining whether or not a transfer target object is accommodated in a normal posture.
Figure 15B:
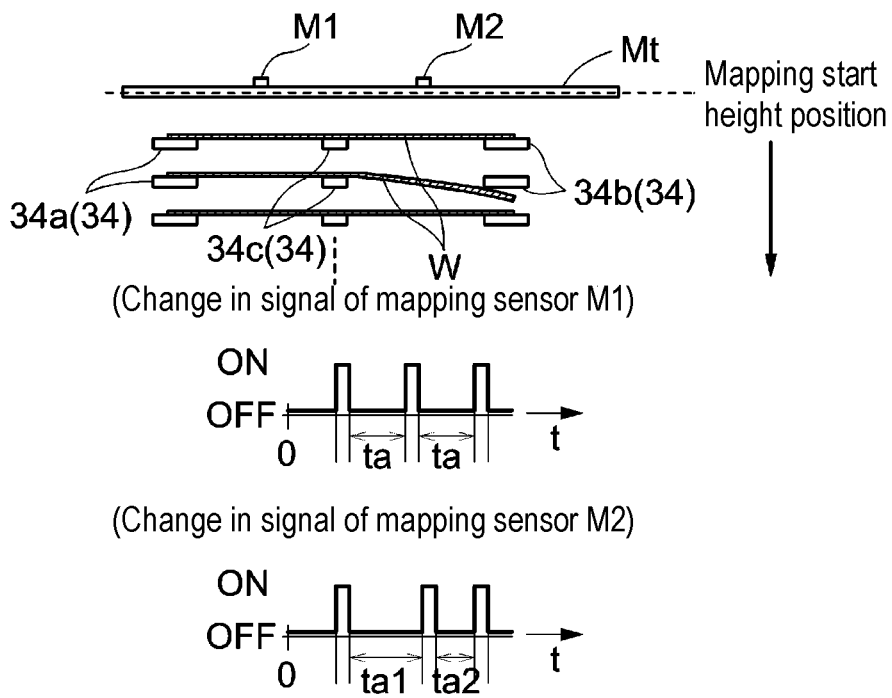

It is considered that as shown in FIG. 15A, the transfer target object W in the uppermost slot 34 in the storage container 3, the transfer target object W in the second slot 34 from the top, and the transfer target object W in the third slot 34 from the top are accommodated in a normal posture (horizontal posture). In that case, when the mapping arm Mt is moved down from the mapping start height position and mapping is performed by the two mapping sensors M1 and M2, the signal ON generated when each of the mapping sensors M1 and M2 detects the end surface Wa of the transfer target object W is outputted at certain time intervals ta. In FIGS. 15A and 15B, the change in the signals of the mapping sensors M1 and M2 is set to 0 when the mapping arm Mt is located at the mapping start height position.

On the other hand, it is considered that, for example, as shown in FIG. 15B, the transfer target object W in the uppermost slot 34 in the storage container 3 and the transfer target object W in the third slot 34 from the top are accommodated in a normal posture (horizontal posture) but the right end portion of the transfer target object W in the second slot 34 from the top is bent downward. In that case, when the mapping arm Mt is moved down from the mapping start height position and mapping is performed by the two mapping sensors M1 and M2, the signal ON generated when the mapping sensors M1 detects the end surface Wa of the transfer target object W is outputted at certain time intervals ta, but the signal ON generated when the mapping sensors M2 detects the end surface Wa of the transfer target object W is not outputted at certain time intervals ta In the case of FIG. 15B, the end surface Wa of the transfer target object W in the second slot 34 from the top is detected when a time ta1 longer than the time ta has elapsed after the end surface Wa of the transfer target object W in the uppermost slot 34 in the storage container 3 is detected. Further, the end surface Wa of the transfer target object W in the third slot 34 from the top is detected when a time ta2 shorter than the time ta has elapsed after the end surface Wa of the transfer target object W in the second slot 34 from the top is detected.

In the second embodiment, the height position detection part 112 detects the height position of the transfer target object W (the height position of the detection target area TA of the mapping sensor M101) based on the sensing information of the mapping sensor M101. However, the present disclosure is not limited thereto.

Therefore, the height position detection part 112 may detect the height position of the transfer target object W (the height position of the detection target area TA of the mapping sensor M101) based on the sensing information of the mapping sensor M101, and may also detect the height position of the transfer target object W (the height position of the detection target area TB of the mapping sensor M102) based on the sensing information of the mapping sensor M102.

In that case, the height position detection part 112 detects the height position on one end side and of the transfer target object W the height position on the other end side of the transfer target object W. Therefore, the determination part MT (good/bad determination part 114) may compare the height position of the mapping sensor M101 with the normal height position of the transfer target object W in each slot 34 for one end side of the transfer target object W to determine whether or not the portion of the transfer target object W in the detection target area TA is located at a normal height position, and may compare the height position of the mapping sensor M102 with the normal height position of the transfer target object W in each slot 34 for the other end side of the transfer target object W to determine whether or not the portion of the transfer target object W in the detection target area TB is located at a normal height position. The same also applies to the above-described third embodiment.

Further, when the height position detection part 112 detects the height position of the transfer target object W on one end side and the height position of the transfer target object W on the other end side, the determination part MT (good/bad determination part 114) may determine whether or not the transfer target object W is accommodated in a normal posture (horizontal posture), based on the difference between the two height positions.

In the second embodiment described above, the normal position memory part 113 stores the downward distance from the mapping start height position of the mapping arm Mt as the normal height position of the transfer target object W. However, the present disclosure is not limited thereto. The normal position memory part 113 may store the distance from an arbitrary position as the normal height position of the transfer target object W.

In the first and second embodiments described above, the beams emitted from the two mapping sensors M101 and M102 have a strip shape extending along the end surface Wa of the transfer target object W. However, only the beam emitted from one of the two mapping sensors M101 and M102 may have a strip shape extending along the end surface Wa of the transfer target object W.

In the first to third embodiments described above, one of the first mapping sensor and the second mapping sensor whose detection target area is the portion near the end of the loading/unloading port may be set as a main mapping sensor, and the remaining mapping sensor may be set as a sub-mapping sensor that operates in synchronization with the main mapping sensor. That is, it is possible to arbitrarily determine which of three or more mapping sensors is set as a main mapping sensor.

In the first to third embodiments described above, the mounting position of the mapping sensors with respect to the mapping arm may be made changeable or adjustable according to the size of the transfer target object, and the like.

In the first to third embodiments described above, the mapping sensors are not limited to the photoelectric sensors, but may be proximity sensors or laser ranging sensors.

In the first to third embodiments described above, the mapping mechanism may be configured to be switchable to the mappable portion or the unmappable position by allowing the mapping arm to support the mapping sensors in a horizontally or substantially horizontally rotatable manner and moving the mapping sensors about a rotation axis. Alternatively, it may be possible to adopt a configuration in which the mapping arm as a whole is tilted to tilt the mapping sensors forward to position the mapping sensors at mapping positions, or a configuration in which the mapping arm as a whole is slid toward the storage container to move the mapping sensors toward the storage container to position the mapping sensors at mapping positions.

In the first to third embodiments described above, the mapping process may be set to be performed even after the transfer target object has been stored in the storage container on the load port by the transfer robot.

In the first to third embodiments described above, the load port may also be applied to a transfer device other than an EFEM.

In the first to third embodiments described above, for example, a plurality of load ports according to the present disclosure is arranged on the wall surface of the transfer chamber, and a part of a sorter device that can exchange transfer target objects between the storage containers mounted on the mounting tables of the respective load ports may be configured by the transfer robot arranged in the transfer chamber.

In the first to third embodiments described above, the number of load ports arranged on the wall surface of the transfer chamber may be one. In the above-described embodiment, the embodiment in which the frame of the load port constitutes a part of the outer wall of the transfer chamber is exemplified. However, the frame may be provided along the outer wall of the transfer chamber.

In the first to third embodiments described above, the bending property of the glass substrate exemplified as the transfer target object varies depending on not only the thickness but also the composition. Such a glass substrate, particularly a thin glass substrate having a thickness of less than 0.4 mm, is easily bent. However, it is possible for the mapping mechanism of the load port of the present disclosure to appropriately determine whether or not the glass substrate is mounted in a normal posture in the storage container. The thickness of the transfer target object is not limited to the thickness of the above-described embodiments, and may be, for example, about 0.2 mm to 3 mm. Further, the transfer target object may be a wafer, a tape frame wafer, an edge ring, a reticle, a liquid crystal transfer target object, a copper laminate, a package substrate, a printed circuit board, a culture plate, a culture container, a dish, a petri dish, or the like. That is, the present disclosure may be applied to a load port for delivering a transfer target object accommodated in a container in various fields such as semiconductors, liquid crystals, and cell culture.

In the first to third embodiments described above, the storage container for accommodating transfer target objects may be an appropriate storage container according to the size of the transfer target objects. As the storage container, an open-type storage container without a container door may also be used. Further, the number of slots supporting one transfer target object, the positions of the slots in the storage container, or the shape of the slots may be appropriately selected and changed. For example, slots may be provided only at the positions where the slots support both side portions of the transfer target object, or slots may be provided at the positions that overlap with the detection target areas of the mapping sensors in the height direction. Even if the slots may be made undetectable by the mapping sensors, or the slots are detected by the mapping sensors, the detection information of the slots may be differentiated from the detection information available when the end surface of the transfer target object is detected. This is also an effective measure to avoid erroneous detection.

In the first to third embodiments described above, there has been illustrated the form in which the load port is provided with the controller that controls the operation of each part such as the movement of the load port door, or the like. However, it may be possible to adopt a configuration in which the operation of the load port is also controlled by the controller (the above-mentioned controller of the entire EFEM or the controller of the processing chamber, which is a host controller) that controls the operation of the host device of the load port (the EFEM or the processing chamber in the above-described embodiments).

In the first to third embodiments described above, the controller may be realized by using a general computer system without having to use a dedicated system. For example, by installing a program on a general-purpose computer from a recording medium in which the program for executing the above-mentioned process is stored, it may be possible to form a controller for executing the above-mentioned process. The means for supplying these programs is arbitrary. In addition to supplying the programs via a predetermined recording medium as described above, the programs may be supplied via, for example, a communication line, a communication network, a communication system, or the like. In this case, for example, the program posted on the bulletin board system (BBS) of the communication network may be provided by superimposing it on a carrier wave via network communication. Then, by starting the program provided in this way and executing it in the same manner as other application programs under the control of an operating system, it is possible to execute the above-described process.

In addition, the specific configuration of each part is not limited to the above embodiment, and various modifications may be made without departing from the spirit of the present disclosure.

According to the present disclosure in some embodiments, by using two mapping sensors provided so as to be spaced apart from each other in the horizontal direction, it is possible to detect an accommodation state of a transfer target object in a storage container accurately and correctly without going through imaging and image processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A load port, comprising:
   a frame including an opening via which a transfer target object is capable of passing in a substantially horizontal posture;
   a load port door configured to engage with a container door capable of opening and closing a loading/unloading port of a storage container including slots capable of accommodating the transfer target object in a multi-stage manner, and to open and close the opening of the frame; and
   a mapping mechanism configured to map information on an accommodation state including presence or absence of the transfer target object in each of the slots in the storage container via the opening and the loading/unloading port,
   wherein the mapping mechanism includes:
      two mapping sensors configured to move up and down integrally with or independently of ascending/descending movement of the load port door when opening and closing the opening, and capable of detecting an end surface of the transfer target object without imaging and image processing by irradiating detection waves toward an inside of the storage container; and a determination part configured to determine whether the accommodation state of the transfer target object is good or bad based on sensing information obtained by the two mapping sensors.

2. The load port of claim 1, wherein the determination part is configured to determine whether or not the transfer target object is accommodated in an inclined posture.

3. The load port of claim 1, wherein the determination part is configured to determine whether or not the transfer target object is located at a normal height position in each of the slots, by detecting a height position of the transfer target object based on the sensing information of at least one of the two mapping sensors and comparing the detected height position with the normal height position of the transfer target object in each of the slots.

4. The load port of claim 1, wherein a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port, and wherein the determination part is configured to:
determine whether or not the transfer target object is located at a normal height position in each of the slots, by detecting a height position of the transfer target object based on the sensing information of at least one of the two mapping sensors and comparing the detected height position with the normal height position of the transfer target object in each of the slots; and
determine whether or not the transfer target object is accommodated in an inclined posture, based on the detected height position of the transfer target object.

5. The load port of claim 1, wherein the mapping mechanism is configured to:
before starting the sensing, by the two mapping sensors, to determine whether the accommodation state of the transfer target object is good or bad,
perform sensing to detect pop-out of the transfer target object stored in the storage container by using at least one of the two mapping sensors.

6. The load port of claim 1, wherein a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port, and wherein the mapping mechanism is configured to:
before starting the sensing, by the two mapping sensors, to determine whether the accommodation state of the transfer target object is good or bad,
perform sensing to detect pop-out of the transfer target object stored in the storage container by using at least one of the two mapping sensors.

7. The load port of claim 3, wherein the mapping mechanism is configured to:
before starting the sensing, by the two mapping sensors, to determine whether the accommodation state of the transfer target object is good or bad,
perform sensing to detect pop-out of the transfer target object stored in the storage container by using at least one of the two mapping sensors.

8. The load port of claim 4, wherein the mapping mechanism is configured to:
before starting the sensing, by the two mapping sensors, to determine whether the accommodation state of the transfer target object is good or bad,
perform sensing to detect pop-out of the transfer target object stored in the storage container by using at least one of the two mapping sensors.

9. The load port of claim 1, wherein a beam emitted from at least one of the two mapping sensors has a strip shape extending along the end surface of the transfer target object.

10. The load port of claim 1, wherein a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port, and wherein a beam emitted from at least one of the two mapping sensors has a strip shape extending along the end surface of the transfer target object.

11. The load port of claim 3, wherein a beam emitted from at least one of the two mapping sensors has a strip shape extending along the end surface of the transfer target object.

12. The load port of claim 4, wherein a beam emitted from at least one of the two mapping sensors has a strip shape extending along the end surface of the transfer target object.

13. The load port of claim 5, wherein a beam emitted from at least one of the two mapping sensors has a strip shape extending along the end surface of the transfer target object.

14. The load port of claim 6, wherein a beam emitted from at least one of the two mapping sensors has a strip shape extending along the end surface of the transfer target object.

15. The load port of claim 7, wherein a beam emitted from at least one of the two mapping sensors has a strip shape extending along the end surface of the transfer target object.

16. The load port of claim 8, wherein a beam emitted from at least one of the two mapping sensors has a strip shape extending along the end surface of the transfer target object.

17. The load port of claim 1, wherein a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port, wherein the first mapping sensor and the second mapping sensor are arranged spaced-apart from each other in a direction that is orthogonal to a direction in which the transfer target object is transferred via the loading/unloading port, wherein an axis of a beam emitted from the first mapping sensor and an axis of a beam emitted from the second mapping sensor are set parallel to each other, and wherein a first detection target area of the first mapping sensor and a second detection target area of the second mapping sensor are set on the transfer target object to be spaced-apart from each other in the direction that is orthogonal to the direction in which the transfer target object is transferred via the loading/unloading port.

18. The load port of claim 4, wherein the determination part is configured to:
determine whether or not the transfer target object is accommodated in an overlapped state with another transfer target object, based on a duration of receiving a signal from at least one of the two mapping sensors, which indicates that an object is detected by the at least one of the two mapping sensors.

19. The load port of claim 18, wherein the transfer target object is of a rectangular shape.

20. A load port, comprising:
a frame including an opening via which a transfer target object is capable of passing in a substantially horizontal posture;
a load port door configured to engage with a container door capable of opening and closing a loading/unloading port of a storage container including slots capable of accommodating the transfer target object in a multi-stage manner, and to open and close the opening of the frame; and
a mapping mechanism configured to map information on an accommodation state including presence or absence of the transfer target object in each of the slots in the storage container via the opening and the loading/unloading port,
wherein the mapping mechanism includes:
two mapping sensors configured to move up and down integrally with or independently of ascending/descending movement of the load port door when opening and closing the opening, and capable of detecting an end surface of the transfer target object by irradiating detection waves toward an inside of the storage container; and
a determination part configured to determine whether the accommodation state of the transfer target object is good or bad based on sensing information obtained by the two mapping sensors,
wherein a detection target area of a first mapping sensor of the two mapping sensors arranged side by side in a horizontal direction is set at one end portion of the loading/unloading port, and a detection target area of a second mapping sensor of the two mapping sensors is set at the other end portion of the loading/unloading port, and
wherein the determination part is configured to:
determine whether or not the transfer target object is located at a normal height position in each of the slots, by detecting a height position of the transfer target object based on the sensing information of at least one of the two mapping sensors and comparing the detected height position with the normal height position of the transfer target object in each of the slots; and
determine whether or not the transfer target object is accommodated in an inclined posture, based on the detected height position of the transfer target object.

* * * * *